(12) United States Patent
Maeda et al.

(10) Patent No.: US 6,314,021 B1
(45) Date of Patent: Nov. 6, 2001

(54) NONVOLATILE SEMICONDUCTOR MEMORY DEVICE AND SEMICONDUCTOR INTEGRATED CIRCUIT

(75) Inventors: Shigenobu Maeda; Tatsuya Kunikiyo; Takuji Matsumoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/715,141

(22) Filed: Nov. 20, 2000

(30) Foreign Application Priority Data

Jun. 8, 2000 (JP) .................................................. 12-171793

(51) Int. Cl.⁷ ...................................................... G11C 7/00
(52) U.S. Cl. ................ 365/185.01; 365/230.01; 257/314
(58) Field of Search ......................... 365/185.01, 230.01; 257/314, 316

(56) References Cited

FOREIGN PATENT DOCUMENTS

| 11-261037 | 9/1999 | (JP) . |
| 11-317506 | 11/1999 | (JP) . |
| 11-317526 | 11/1999 | (JP) . |

OTHER PUBLICATIONS

Y. Hirano, et al., "Bulk–Layout–Compatible 0.18 μm SOI–CMOS Technology Using Body–Fixed Partial Trench Isolation (PTI)," 1999 IEEE International SOI Conference, Oct. 1999, p. 131.

Nikkei Microdevices, Mar. 2000, pp. 54–86.

*Primary Examiner*—Terrell W. Fears
(74) *Attorney, Agent, or Firm*—Oblon, Spivak, McClelland, Maier & Neustadt, P.C.

(57) ABSTRACT

All source regions belonging to a row are electrically connected to one another through a silicon layer (4) in a portion between a bottom surface of a partial-isolation insulating film (5) and an upper surface of a BOX layer (3). These constitute source lines (SL1 to SL5) extending like strips in a row direction. The isolation insulating film (5) between the source regions adjacent to each other in the row direction is removed and in the silicon layer (4) of the portion exposed by removing the isolation insulating film (5), an impurity introduction region (10) having the same conductivity type as the source region has is formed. With this structure, a nonvolatile semiconductor memory device which causes no malfunction due to driving of a parasitic bipolar transistor can be provided.

15 Claims, 30 Drawing Sheets

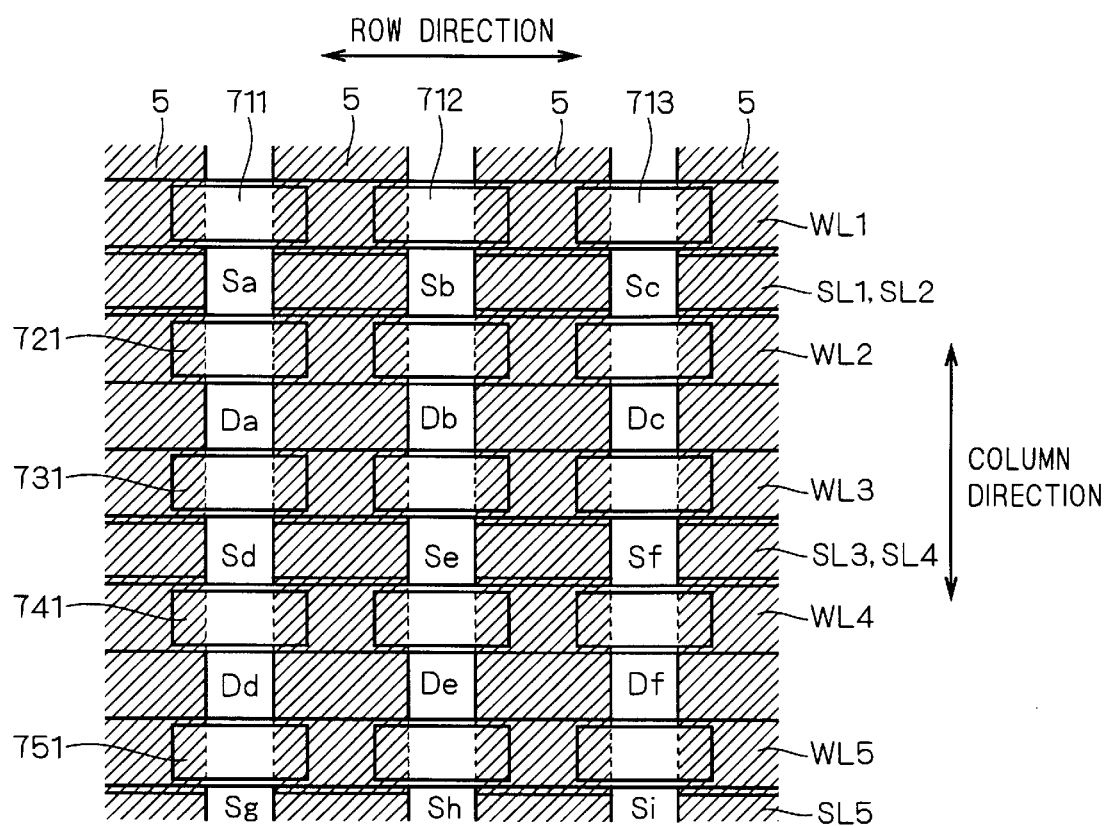
F I G. 3

F I G. 9
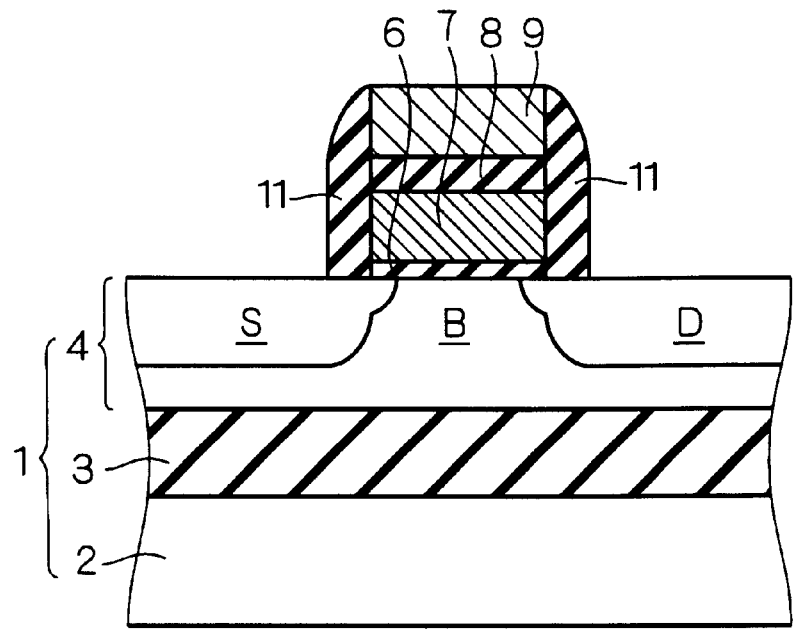
F I G. 10
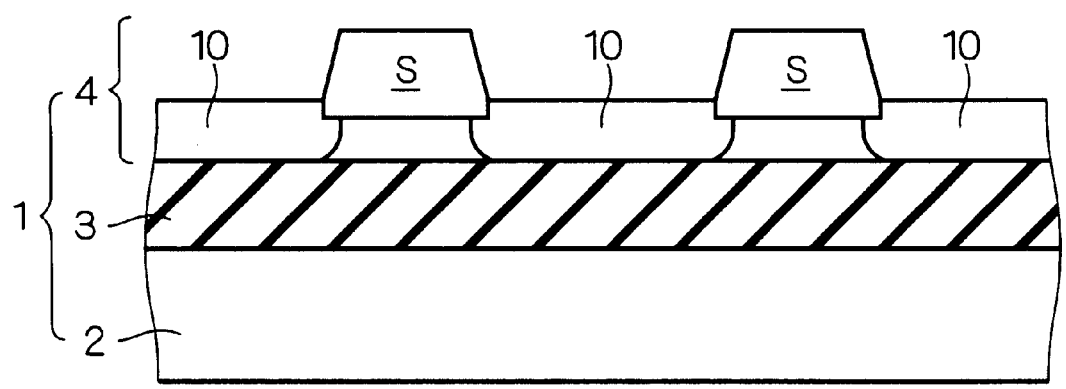

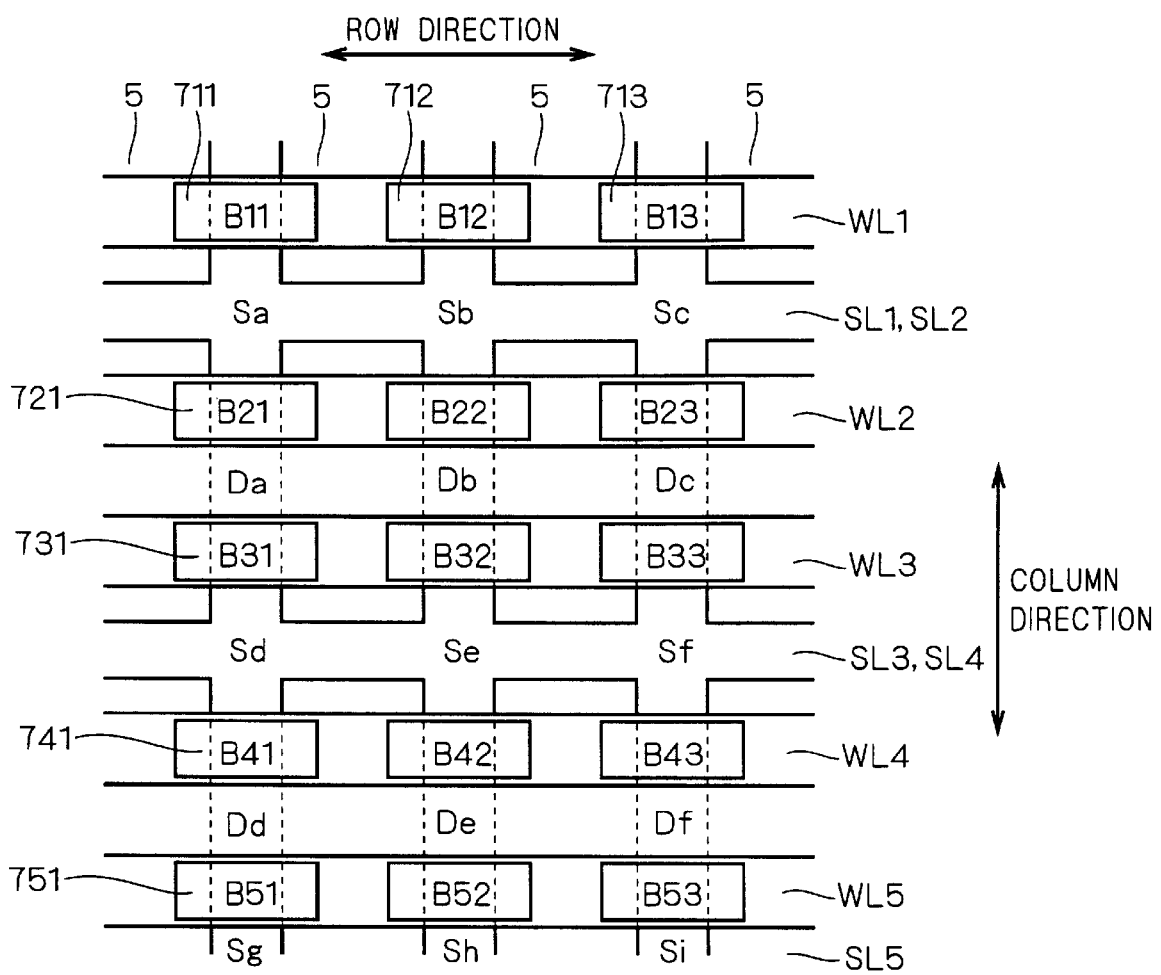
F I G. 12

F I G. 31
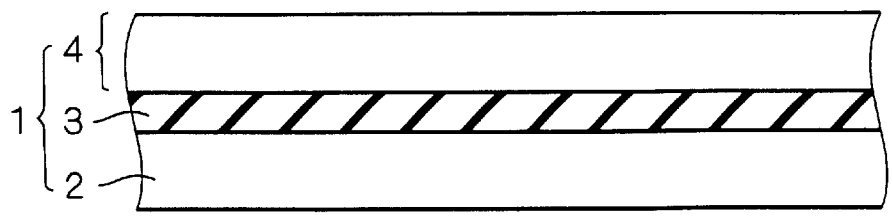
F I G. 32
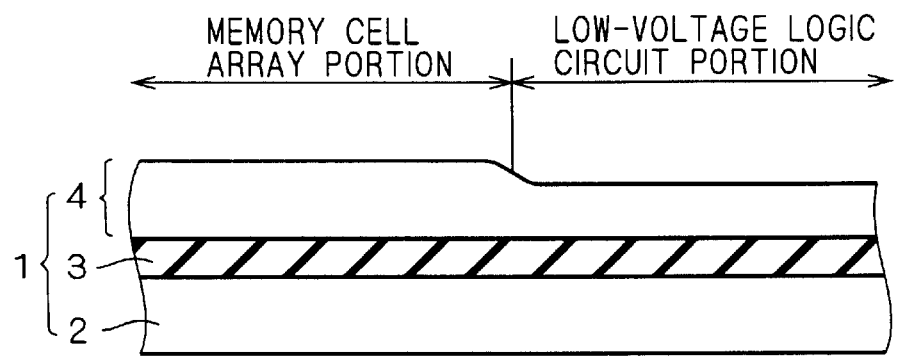
F I G. 33
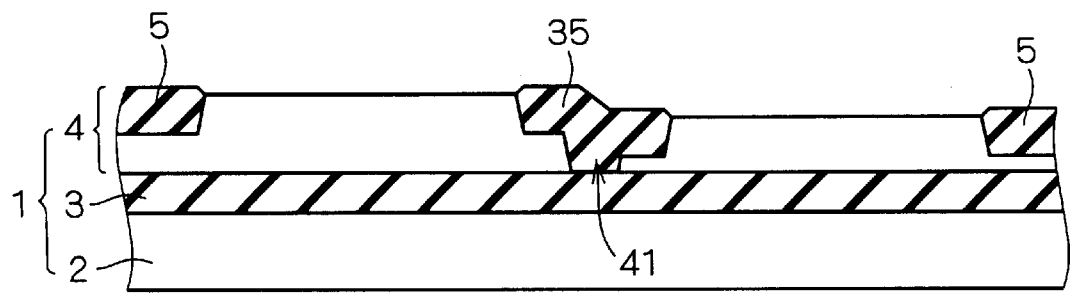

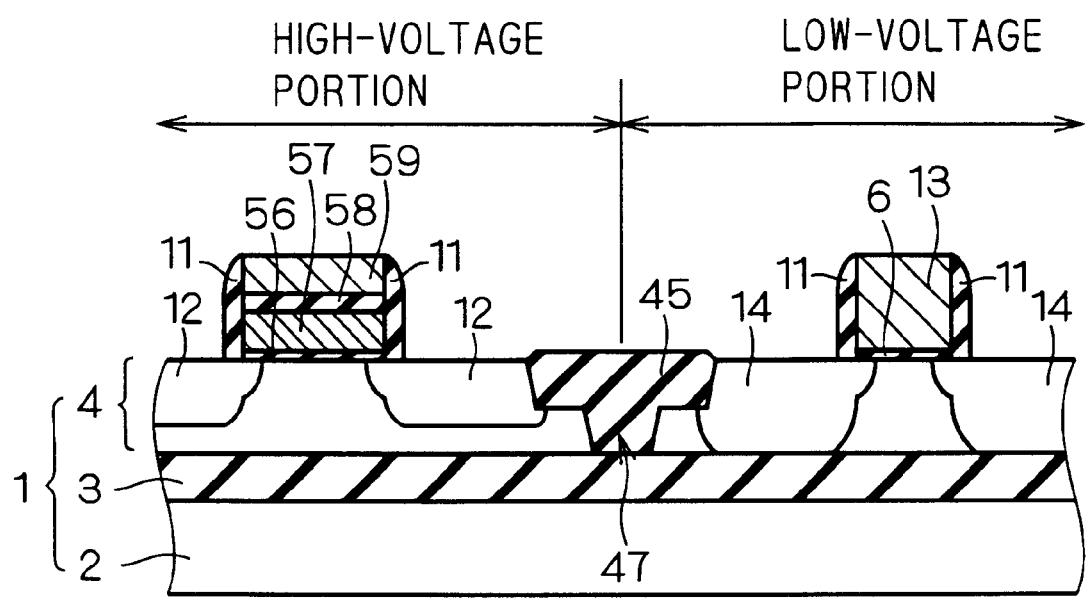
F I G. 43

NONVOLATILE SEMICONDUCTOR MEMORY DEVICE AND SEMICONDUCTOR INTEGRATED CIRCUIT

BACKGROUND OF THE INVENTION

1. Field of the Invention

The present invention relates to a structure of a nonvolatile semiconductor memory device, and more particularly to a structure of a flash memory using an SOI (Silicon On Insulator) substrate. The present invention also relates to a semiconductor integrated circuit such as an LSI in which the nonvolatile semiconductor memory device is formed.

2. Description of the Background Art

FIG. 46 is a cross section schematically showing a structure of a memory cell transistor in a flash memory using a bulk substrate (which refers to an ordinary semiconductor substrate, not an SOI substrate). In an upper surface of a silicon substrate 101, a source region 102s and a drain region 102d which are paired are formed away from each other. On the upper surface of the silicon substrate 101 in a portion between the source region 102s and the drain region 102d formed is a multilayer structure in which a gate oxide film 103, a floating gate 104, an insulating film 105 and a control gate 106 are layered in this order. On a side surface of the multilayer structure, a sidewall 107 is formed of the insulating film.

In a write operation of data, a high voltage is applied to the drain region 102d and the control gate 106 with a ground potential applied to the source region 102s, for example. Through this application, hot electrons generated in a high-field region near a channel region and the drain region 102d are implanted into the floating gate 104.

FIG. 47 is a cross section schematically showing a structure of a memory cell transistor in a flash memory using the SOI substrate. An SOI substrate 108 has a multilayer structure in which a silicon substrate 109, a BOX (Buried Oxide) layer 110 and a silicon layer 111 are layered in this order. In the silicon layer 111, a full-isolation insulating film 112 extending from an upper surface of the silicon layer 111 to reach an upper surface of the BOX layer 110 is selectively formed. In an element formation region defined by the isolation insulating film 112, the paired source region 102s and drain region 102d are formed away from each other. A bottom surface of the source region 102s and that of the drain region 102d reach the upper surface of the BOX layer 110.

Further, on the upper surface of a body region, that is, the silicon layer 111 in a portion between the source region 102s and the drain region 102d formed is the multilayer structure in which the gate oxide film 103, the floating gate 104, the insulating film 105 and the control gate 106 are layered in this order. On the side surface of the multilayer structure, the sidewall 107 is formed of the insulating film.

FIG. 48 is a circuit diagram showing part of a configuration of a memory cell array in the flash memory. FIG. 48 shows a configuration consisting of only fifteen memory cells in a matrix with five rows and three columns. Each memory cell comprises the memory cell transistor shown in FIG. 47. The control gates CG of the memory cell transistors in the memory cells belonging to a row are connected to a common word line. For example, the control gates CG of the memory cell transistors in the memory cells MC11 to MC13 are connected in common to a word line WL101.

Further, sources S of the memory cell transistors in the memory cells belonging to a row are connected to a common source line. For example, the sources S of the memory cell transistors in the memory cells MC11 to MC13 are connected in common to a source line SL101. Respective source lines SL101 to SL105 in the rows are connected to a common source line SL100.

Furthermore, drains D of the memory cell transistors in the memory cells belonging to a column are connected to a common bit line. For example, the drains D of the memory cell transistors in the memory cells MC11 to MC51 are connected in common to a bit line BL101.

FIG. 49 is a plan view showing a structure of the background-art nonvolatile semiconductor memory device using the configuration of the memory cell array shown in FIG. 48. In FIG. 49, an arrangement of the floating gate, the word line (also used as the control gate), the source line and the isolation insulating film is schematically shown. For example, floating gates 411, 412, and 421 shown in FIG. 49 correspond to the respective floating gates FG in the memory cell transistors of the memory cells MC11, MC12, MC21 shown in FIG. 48.

Further, for example, a source region Sa shown in FIG. 49 corresponds to the respective sources S in the memory cell transistors of the memory cells MC11 and MC21 shown in FIG. 48, and a source region Sd shown in FIG. 49 corresponds to the respective sources S in the memory cell transistors of the memory cells MC31 and MC41 shown in FIG. 48.

Furthermore, for example, a drain region Da shown in FIG. 49 corresponds to the respective drains D in the memory cell transistors of the memory cells MC21 and MC31 shown in FIG. 48, and a drain region Dd shown in FIG. 49 corresponds to the respective drains D in the memory cell transistors of the memory cells MC41 and MC51 shown in FIG. 48.

Referring to FIG. 49, the source lines SL101 and SL102 include the source regions Sa to Sc, the source lines SL103 and SL104 include the source regions Sd to Sf, and the source line SL105 includes the source regions Sg to Si. Each of the source lines SL101 to SL105 is formed by providing a region where no isolation insulating film 112 is formed between the rows.

FIG. 50 is a cross section showing a cross-sectional structure taken along the line X100 of FIG. 49. The source region Sa and the source region Sb are isolated from each other by the full-isolation insulating film 112.

This background-art nonvolatile semiconductor memory device, however, has the following problem. Referring to FIG. 47, this problem will be discussed. As discussed above, in the write operation of data, a high voltage is applied to the drain region 102d and the control gate 106 with a ground potential applied to the source region 102s. At this time, a large number of pairs of electrons and positive holes are generated near the channel region and the drain region 102d through an collision ionization.

In the background-art nonvolatile semiconductor memory device using the SOI substrate, since the body region is in an electrically floating state, the positive holes are accumulated in the body region. Therefore, as the body potential rises, a parasitic bipolar transistor consisting of the source region 102s, the drain region 102d and the body region is driven and as a result, a parasitic bipolar current is carried from the source region 102s towards the drain region 102d, to cause a malfunction. Thus, in the background-art nonvolatile semiconductor memory device, the positive holes are accumulated in the body region due to the electrically floating state of the body region, to drive the parasitic bipolar transistor, thereby disadvantageously causing a malfunction.

SUMMARY OF THE INVENTION

The present invention is directed to a nonvolatile semiconductor memory device. According to a first aspect of the present invention, the nonvolatile semiconductor memory device comprises: an SOI substrate in which a semiconductor substrate, an insulating layer and a semiconductor layer are layered in this order; a plurality of memory cell transistors arranged in a matrix, each having a source region and a drain region which are formed away from each other in a main surface of the semiconductor layer, a first gate electrode formed on a body region between the source region and the drain region with an insulating film interposed therebetween, and a second gate electrode formed on the first gate electrode with an insulating film interposed therebetween; an isolation insulating film formed between adjacent ones of the plurality of memory cell transistors in a row direction perpendicular to a direction in which the source region and the drain region of each of the plurality of memory cell transistors are aligned in the main surface of the semiconductor layer, having a bottom surface which does not reach the insulating layer; and an impurity introduction region formed between the source regions included in adjacent ones of the plurality of memory cell transistors in the row direction in the semiconductor layer, having the same conductivity type as the source region has.

According to a second aspect of the present invention, in the nonvolatile semiconductor memory device of the first aspect, the source region or a depletion layer in a pn junction between the source region and the semiconductor layer does not reach the insulating layer.

According to a third aspect of the present invention, in the nonvolatile semiconductor memory device of the second aspect, the drain region or a depletion layer in a pn junction between the drain region and the semiconductor layer does not reach the insulating layer.

According to a fourth aspect of the present invention, in the nonvolatile semiconductor memory device of the second aspect, the drain region or a depletion layer in a pn junction between the drain region and the semiconductor layer reaches the insulating layer.

According to a fifth aspect of the present invention, in the nonvolatile semiconductor memory device of the first aspect, both the source region and the drain region or both depletion layers in pn junctions between the source region and the semiconductor layer and between the drain region and the semiconductor layer reach the insulating layer, and the nonvolatile semiconductor memory device of the fifth aspect further comprises: a word line connected in common to the second gate electrodes included in the plurality of memory cell transistors belonging to a row; a body line connecting the body regions included in the plurality of memory cell transistors belonging to a row; a first driving circuit connected to the word line, for supplying the word line with a first driving signal; and a second driving circuit connected to the body line, for supplying the body line with a second driving signal.

According to a sixth aspect of the present invention, in the nonvolatile semiconductor memory device of the fifth aspect, the first and second driving circuits are arranged on the opposite sides with a memory cell array portion sandwiched therebetween, in which a plurality of memory cells including the plurality of memory cell transistors are arranged.

According to a seventh aspect of the present invention, the nonvolatile semiconductor memory device comprises: an SOI substrate in which a semiconductor substrate, an insulating layer and a semiconductor layer are layered in this order; a plurality of memory cell transistors arranged in a matrix, each having a source region and a drain region which are formed away from each other in a main surface of the semiconductor layer, a first gate electrode formed on a body region between the source region and the drain region with an insulating film interposed therebetween, and a second gate electrode formed on the first gate electrode with an insulating film interposed therebetween; and an isolation insulating film formed between adjacent ones of the plurality of memory cell transistors in a row direction perpendicular to a direction in which the source region and the drain region of each of the plurality of memory cell transistors are aligned in the main surface of the semiconductor layer, having a bottom surface which does not reach the insulating layer, and in the nonvolatile semiconductor memory device of the seventh aspect, the source region or a depletion layer in a pn junction between the source region and the semiconductor layer does not reach the insulating layer, and the drain region or a depletion layer in a pn junction between the drain region and the semiconductor layer reaches the insulating layer.

According to an eighth aspect of the present invention, the nonvolatile semiconductor memory device comprises: an SOI substrate in which a semiconductor substrate, an insulating layer and a semiconductor layer are layered in this order; a plurality of memory cell transistors arranged in a matrix, each having a source region and a drain region which are formed away from each other in a main surface of the semiconductor layer, a first gate electrode formed on a body region between the source region and the drain region with an insulating film interposed therebetween, and a second gate electrode formed on the first gate electrode with an insulating film interposed therebetween; an isolation insulating film formed between adjacent ones of the plurality of memory cell transistors in a row direction perpendicular to a direction in which the source region and the drain region of each of the plurality of memory cell transistors are aligned in the main surface of the semiconductor layer, having a bottom surface which does not reach the insulating layer; a word line connected in common to the second gate electrodes included in the plurality of memory cell transistors belonging to a row; a body line connecting the body regions included in the plurality of memory cell transistors belonging to a row; a first driving circuit connected to the word line, for supplying the word line with a first driving signal; and a second driving circuit connected to the body line, for supplying the body line with a second driving signal, and in the nonvolatile semiconductor memory device of the eighth aspect, both the source region and the drain region or both depletion layers in pn junctions between the source region and the semiconductor layer and between the drain region and the semiconductor layer reach the insulating layer.

According to a ninth aspect of the present invention, in the nonvolatile semiconductor memory device of the eighth aspect, the first and second driving circuits are arranged on the opposite sides with a memory cell array portion sandwiched therebetween, in which a plurality of memory cells including the plurality of memory cell transistors are arranged.

According to a tenth aspect of the present invention, in the nonvolatile semiconductor memory device of any one of the fifth, sixth, eighth and ninth aspects, the second driving circuit supplies the body line which is selected in reading data with a first potential as the second driving signal and supplies the body line which is not selected with a ground potential or a second potential having a polarity reverse to that of the first potential as the second driving signal.

According to an eleventh aspect of the present invention, in the nonvolatile semiconductor memory device of any one of the fifth, sixth, eighth, ninth and tenth aspects, the second driving circuit supplies the body line with the second driving signal before the first driving circuit supplies the word line with the first driving signal.

According to a twelfth aspect of the present invention, in the nonvolatile semiconductor memory device of any one of the seventh to eleventh aspects further comprises: an impurity introduction region formed between the source regions included in adjacent ones of the plurality of memory cell transistors in the row direction in the semiconductor layer, having the same conductivity type as the source region has.

The present invention is also directed to a semiconductor integrated circuit. According to a thirteenth aspect of the present invention, the semiconductor integrated circuit comprises: an SOI substrate in which a semiconductor substrate, an insulating layer and a semiconductor layer are layered in this order; a plurality of memory cell transistors formed in a memory cell array portion of the SOI substrate; and a plurality of low-voltage transistors formed in a low-voltage portion of the SOI substrate, being driven by a voltage lower than a driving voltage of the plurality of memory cell transistors, and in the semiconductor integrated circuit of the thirteenth aspect, the plurality of memory cell transistors and the plurality of low-voltage transistors each have a source region and a drain region which are formed away from each other in the semiconductor layer, the source region or a depletion layer in a pn junction between the source region and the semiconductor layer in each of the plurality of memory cell transistors does not reach the insulating layer, and both the source region and the drain region or both depletion layers in pn junctions between the source region and the semiconductor layer and between the drain region and the semiconductor layer in each of the plurality of low-voltage transistors reach the insulating layer.

According to a fourteenth aspect of the present invention, in the semiconductor integrated circuit of the thirteenth aspect, the depth from a main surface of the semiconductor layer to bottom surfaces of the source region and the drain region of each of the plurality of low-voltage transistors is deeper than that from the main surface of the semiconductor layer to a bottom surface of the source region of each of the plurality of memory cell transistors.

According to a fifteenth aspect of the present invention, in the semiconductor integrated circuit of the thirteenth aspect, the film thickness of the semiconductor layer in the low-voltage portion is thinner than that of the semiconductor layer in the memory cell array portion.

According to a sixteenth aspect of the present invention, the semiconductor integrated circuit of any one of the thirteenth to fifteenth aspects further comprises an isolation insulating film formed in an interface between the memory cell array portion and the low-voltage portion in the semiconductor layer, of which bottom surface reaches the insulating layer.

According to a seventeenth aspect of the present invention, the semiconductor integrated circuit comprises: a substrate having a memory cell array portion in which a plurality of memory cell transistors are formed; a low-voltage portion in which a plurality of low-voltage transistors which are driven by a voltage lower than a driving voltage of the plurality of memory cell transistors are formed; and a high-voltage portion in which a plurality of high-voltage transistors which are driven by a voltage lower than a driving voltage of the plurality of low-voltage portions are formed, and in the semiconductor integrated circuit of the seventeenth aspect, the high-voltage portion and the low-voltage portion are arranged with the memory cell array portion sandwiched.

According to an eighteenth aspect of the present invention, in the semiconductor integrated circuit of the seventeenth aspect, the low-voltage portion is divided into a plurality of circuit blocks, and a radio frequency circuit portion in which a radio frequency circuit is formed is provided in one of the plurality of circuit blocks which is positioned farthest away from the high-voltage portion.

According to a nineteenth aspect of the present invention, in the semiconductor integrated circuit of the eighteenth aspect, the substrate is an SOI substrate in which a semiconductor substrate, an insulating layer and a semiconductor layer are layered in this order, and the semiconductor integrated circuit of the nineteenth aspect further comprises: a first isolation insulating film formed in each of interfaces between the memory cell array portion and the low-voltage portion and between the memory cell array portion and the high-voltage portion in the semiconductor layer, having a bottom surface which reaches the insulating layer; and a second isolation insulating film formed in each of interfaces between the radio frequency circuit portion and other portions in the semiconductor layer, having a bottom surface which reaches the insulating layer and being wider than the first isolation insulating film.

According to a twentieth aspect of the present invention, in the semiconductor integrated circuit of the seventeenth aspect, the substrate is an SOI substrate in which a semiconductor substrate, an insulating layer and a semiconductor layer are layered in this order, and the semiconductor integrated circuit of the twentieth aspect further comprises: a first isolation insulating film formed between adjacent ones of the plurality of memory cell transistors in a main surface of the semiconductor layer, having a bottom surface which does not reach the insulating layer; and a second isolation insulating film formed between adjacent ones of the plurality of low-voltage transistors in the main surface of the semiconductor layer, having a bottom surface which does not reach the insulating layer, and in the semiconductor integrated circuit of the twentieth aspect, the depth from the main surface of the semiconductor layer to the bottom surface of the first isolation insulating film is deeper than that from the main surface of the semiconductor layer to the bottom surface of the second isolation insulating film.

According to a twenty-first aspect of the present invention, in the semiconductor integrated circuit of the seventeenth aspect, the substrate is an SOI substrate in which a semiconductor substrate, an insulating layer and a semiconductor layer are layered in this order, and the semiconductor integrated circuit of the twenty-first aspect further comprises: a first isolation insulating film formed between adjacent ones of the plurality of memory cell transistors in a main surface of the semiconductor layer, in which a first channel cut layer is formed adjacently to a bottom surface thereof; and a second isolation insulating film formed between adjacent ones of the plurality of low-voltage transistors in a main surface of the semiconductor layer, in which a second channel cut layer is formed adjacently to a bottom surface thereof, and in the semiconductor integrated circuit of the twenty-first aspect, the impurity concentration of the first channel cut layer is higher than that of the second channel cut layer.

According to a twenty-second aspect of the present invention, in the semiconductor integrated circuit of the seventeenth aspect, the threshold voltage of each of the plurality of memory cell transistors is higher than that of each of the plurality of low-voltage transistors.

According to a twenty-third aspect of the present invention, the semiconductor integrated circuit comprises: an SOI substrate in which a semiconductor substrate, an insulating layer and a semiconductor layer are layered in this order, having a memory cell array portion in which a plurality of memory cell transistors are formed, a low-voltage portion in which a plurality of low-voltage transistors which are driven by a voltage lower than a driving voltage of the plurality of memory cell transistors are formed, and a high-voltage portion in which a plurality of high-voltage transistors which are driven by a voltage lower than a driving voltage of the plurality of low-voltage portions are formed; and a first isolation insulating film formed in each of interfaces between the memory cell array portion and the low-voltage portion and between the memory cell array portion and the high-voltage portion in the semiconductor layer, having a bottom surface which reaches the insulating layer.

According to a twenty-fourth aspect of the present invention, in the semiconductor integrated circuit of the twenty-third aspect, the high-voltage portion has a portion adjacent to the low-voltage portion, and the semiconductor integrated circuit of the twenty-fourth aspect further comprises: a second isolation insulating film formed in the semiconductor layer in the portion, having a bottom surface which reaches the insulating layer and being wider than the first isolation insulating film.

In the nonvolatile semiconductor memory device of the first aspect of the present invention, the adjacent source regions in the row direction can be electrically connected to each other through the semiconductor layer, thereby consisting a source line.

Further, since the impurity introduction region which has the same conductivity type as the source regions has between the adjacent source regions in the row direction, it is also possible to reduce the resistance of the source line.

In the nonvolatile semiconductor memory device of the second aspect of the present invention, it is possible to avoid the rise of body resistance in the column direction.

Further, also between the adjacent memory cells in the column direction, it is possible to fix the body potential through the semiconductor layer of a portion between the source region and the insulating layer.

In the nonvolatile semiconductor memory device of the third aspect of the present invention, since the body potential can be fixed through the semiconductor layer of a portion between the drain region and the insulating layer in the adjacent memory cell transistors in the column direction, it is possible to improve the capability of fixing the body potential.

In the nonvolatile semiconductor memory device of the fourth aspect of the present invention, since the pn junction capacitance in the pn junction between the drain region and the semiconductor layer, it is possible to maintain the read and write operations of data at high speed and low power consumption.

In the nonvolatile semiconductor memory device of the fifth aspect of the present invention, since a bipolar current can be also carried from the source region to the drain region of the memory cell transistor by driving the body line as well as the word line in performing the write operation of data, it is possible to improve the efficiency in writing data.

In the nonvolatile semiconductor memory device of the sixth aspect of the present invention, since the first driving circuit and the second driving circuit are arranged on the opposite sides with the memory cell array portion sandwiched therebetween, the effect of voltage drop caused by the resistances of the word line and the body line can be offset. This can make the writing characteristics uniform in a plurality of memory cells belonging to a row.

In the nonvolatile semiconductor memory device of the seventh aspect of the present invention, it is possible to avoid the rise of the body resistance in the column direction.

Further, the body potential can be fixed through the semiconductor layer of a portion between the source region and the insulating layer in the adjacent memory cells in the column direction.

Furthermore, since the pn junction capacitance in the pn junction between the drain region and the semiconductor layer can be reduced, it is possible to maintain the read and write operations of data at high speed and low power consumption.

In the nonvolatile semiconductor memory device of the eighth aspect of the present invention, since a bipolar current can be also carried from the source region to the drain region of the memory cell transistor by driving the body line as well as the word line in performing the write operation of data, it is possible to improve the efficiency in writing data.

In the nonvolatile semiconductor memory device of the ninth aspect of the present invention, since the first driving circuit and the second driving circuit are arranged on the opposite sides with the memory cell array portion sandwiched therebetween, the effect of voltage drop caused by the resistances of the word line and the body line can be offset. This can make the writing characteristics uniform in a plurality of memory cells belonging to a row.

In the nonvolatile semiconductor memory device of the tenth aspect of the present invention, it is possible to avoid a disturb failure.

In the nonvolatile semiconductor memory device of the eleventh aspect of the present invention, even if the resistance of the body line is higher than that of the word line, it is possible to avoid the lag of the second driving signal behind the first driving signal.

In the nonvolatile semiconductor memory device of the twelfth aspect of the present invention, the resistance of the source line can be reduced by forming the impurity introduction region between the adjacent source regions in the row direction.

In the semiconductor integrated circuit of the thirteenth aspect of the present invention, it is possible to improve the capability of fixing the body potential in the memory cell array portion while avoiding a decrease in operation speed and an increase in power consumption which are caused as the pn junction capacitance increases in the low-voltage portion.

In the semiconductor integrated circuit of the fourteenth aspect of the present invention, both the source region and the drain region or both the depletion layers in the pn junctions between the source region and the semiconductor layer and between the drain region and the semiconductor layer can reach the insulating layer only in the low-voltage portion.

In the semiconductor integrated circuit of the fifteenth aspect of the present invention, both the source region and the drain region or both the depletion layers in the pn junctions between the source region and the semiconductor layer and between the drain region and the semiconductor layer can reach the insulating layer only in the low-voltage portion.

Further, the source region in the memory cell array portion which does not reaches the insulating layer and the source region and the drain region in the low-voltage portion which reach the insulating layer can be formed through the same ion implantation process.

In the semiconductor integrated circuit of the sixteenth aspect of the present invention, it is possible to prevent the noises generated in the memory cell array portion and the low-voltage portion from being mutually propagated through the semiconductor layer. Therefore, the semiconductor integrated circuit of the sixteenth aspect is unlikely to be affected by the noises.

In the semiconductor integrated circuit of the seventeenth aspect of the present invention, since the high-voltage portion and the low-voltage portion are arranged on the opposite sides of the substrate with said memory cell array portion sandwiched therebetween, it is possible to prevent the low-voltage portion from being affected by the noise generated in the high-voltage portion which is likely to become a source of noise.

In the semiconductor integrated circuit of the eighteenth aspect of the present invention, it is possible to relieve the effect of noise generated in the high-voltage portion on the radio frequency circuit which is likely to be affected by the noise.

In the semiconductor integrated circuit of the nineteenth aspect of the present invention, by forming the first isolation insulating film, it is possible to prevent the noises generated in the memory cell array portion, the low-voltage portion and the high-voltage portion from being mutually propagated through the semiconductor layer. Therefore, the semiconductor integrated circuit of the nineteenth aspect is unlikely to be affected by the noises.

Further, by forming the second isolation insulating film, it is possible to reduce the effect of the noise generated in regions other than the radio frequency circuit portion on the radio frequency circuit portion.

In the semiconductor integrated circuit of the twentieth aspect of the present invention, it is possible to enhance the isolation breakdown voltage of the first isolation insulating film in the memory cell array portion where a voltage higher than that in the low-voltage portion is dealt.

In the semiconductor integrated circuit of the twenty-first aspect of the present invention, it is possible to enhance the isolation breakdown voltage of the first isolation insulating film in the memory cell array portion where a voltage higher than that in the low-voltage portion is dealt.

In the semiconductor integrated circuit of the twenty-second aspect of the present invention, it is possible to enhance a punch through resistance of a transistor in the memory cell array portion.

In the semiconductor integrated circuit of the twenty-third aspect of the present invention, it is possible to prevent the noises generated in the memory cell array portion, the low-voltage portion and the high-voltage portion from being mutually propagated through the semiconductor layer. Therefore, the semiconductor integrated circuit of the twenty-third aspect is unlikely to be affected by the noises.

In the semiconductor integrated circuit of the twenty-fourth aspect of the present invention, by forming the second isolation insulating film having a high isolation breakdown voltage, it is possible to prevent the mutual effect of noises generated in the adjacent high-voltage portion and the low-voltage portion.

An object of the present invention is to provide a non-volatile semiconductor memory device which avoids accumulation of the positive holes in the body region and therefore causes no malfunction due to driving of the parasitic bipolar transistor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view showing a structure of the nonvolatile semiconductor memory device in accordance with the first preferred embodiment of the present invention;

FIGS. 9 and 10 are cross sections showing a structure of a nonvolatile semiconductor memory device in accordance with a second preferred embodiment of the present invention;

FIG. 12 is a plan view showing a structure of a nonvolatile semiconductor memory device in accordance with a variation of the third preferred embodiment of the present invention;

FIGS. 31 to 34 are cross sections showing a method of manufacturing the semiconductor integrated circuit shown in FIG. 30 step by step;

FIG. 28 is a plan view schematically showing a structure of a semiconductor integrated circuit in accordance with a second variation of the seventh preferred embodiment of the present invention;

FIGS. 41 to 43 are cross sections showing a structure of a semiconductor integrated circuit in accordance with a tenth preferred embodiment of the present invention;

DESCRIPTION OF THE PREFERRED EMBODIMENTS

The First Preferred Embodiment

Figure 1:
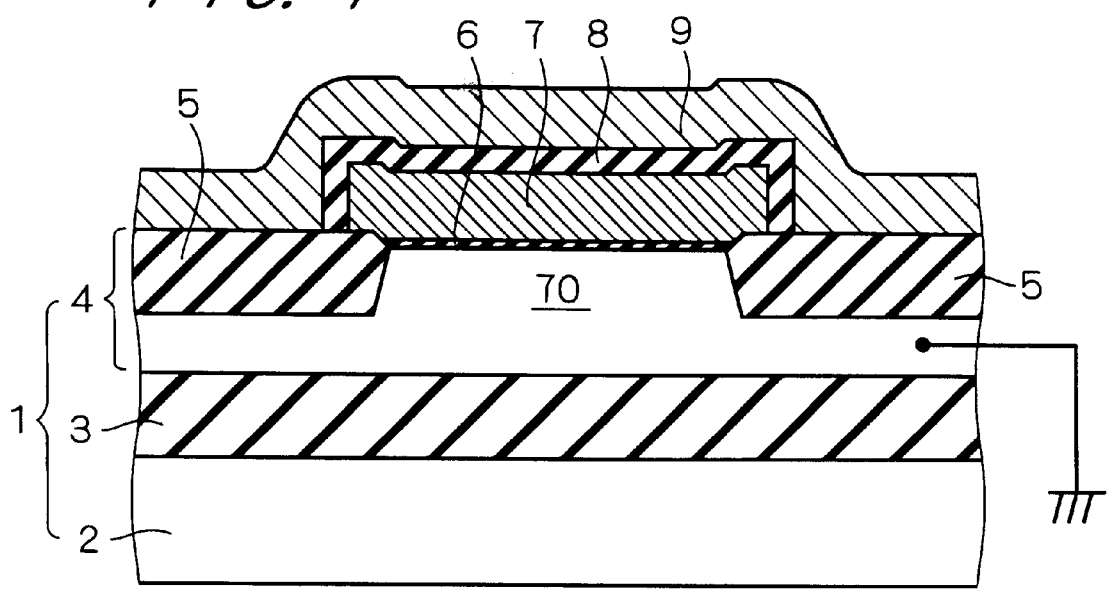
FIG. 1 is a cross section showing a structure of a memory cell transistor in a nonvolatile semiconductor memory device in accordance with a first preferred embodiment of the present invention.

FIG. 1 is a cross section showing a structure of a memory cell transistor in a flash memory in accordance with the first preferred embodiment of the present invention. An SOI substrate 1 has a multilayer structure in which a silicon substrate 2, a BOX layer 3 and a silicon layer 4 are layered in this order. In an upper surface of the silicon layer 4, a partial trench isolation (hereinafter, simply referred to as "partial-isolation") insulating film 5 whose bottom surface does not reach an upper surface of the BOX layer 3 is selectively formed. In an element formation region defined by the isolation insulating film 5, inside the upper surface of the silicon layer 4 formed are a source region and a drain region (not shown in FIG. 1) which are paired with a body region 70 interposed therebetween. Further, on the upper surface of the silicon layer 4 in a portion where the body region 70 is formed, a multilayer structure in which a gate oxide film 6, a floating gate 7, an insulating film 8 and a control gate 9 are layered in this order, and on a side surface of the multilayer structure, a sidewall 11 (not shown in FIG. 1) is formed, constituting a gate electrode structure.

Thus, as an isolation insulating film to isolate memory cells adjacent to each other, the partial-isolation insulating film 5 is used, instead of the full-isolation insulating film, to thereby externally fix a potential of the body region 70 through the silicon layer 4 in a portion between the bottom surface of the isolation insulating film 5 and the upper surface of the BOX layer 3. Therefore, it is possible to avoid a malfunction caused by accumulation of the positive holes in the body region 70 and enhance a breakdown voltage between the source and the drain. As a result, a memory cell transistor which can perform write and read operations of data with a high voltage can be obtained.

Further, by using the partial-isolation insulating film 5 in a peripheral circuit portion where peripheral circuits such as a sense amplifier as well as in the memory cell array portion where the memory cells are formed, it is possible to enhance the source-drain breakdown voltage.

Figure 2:
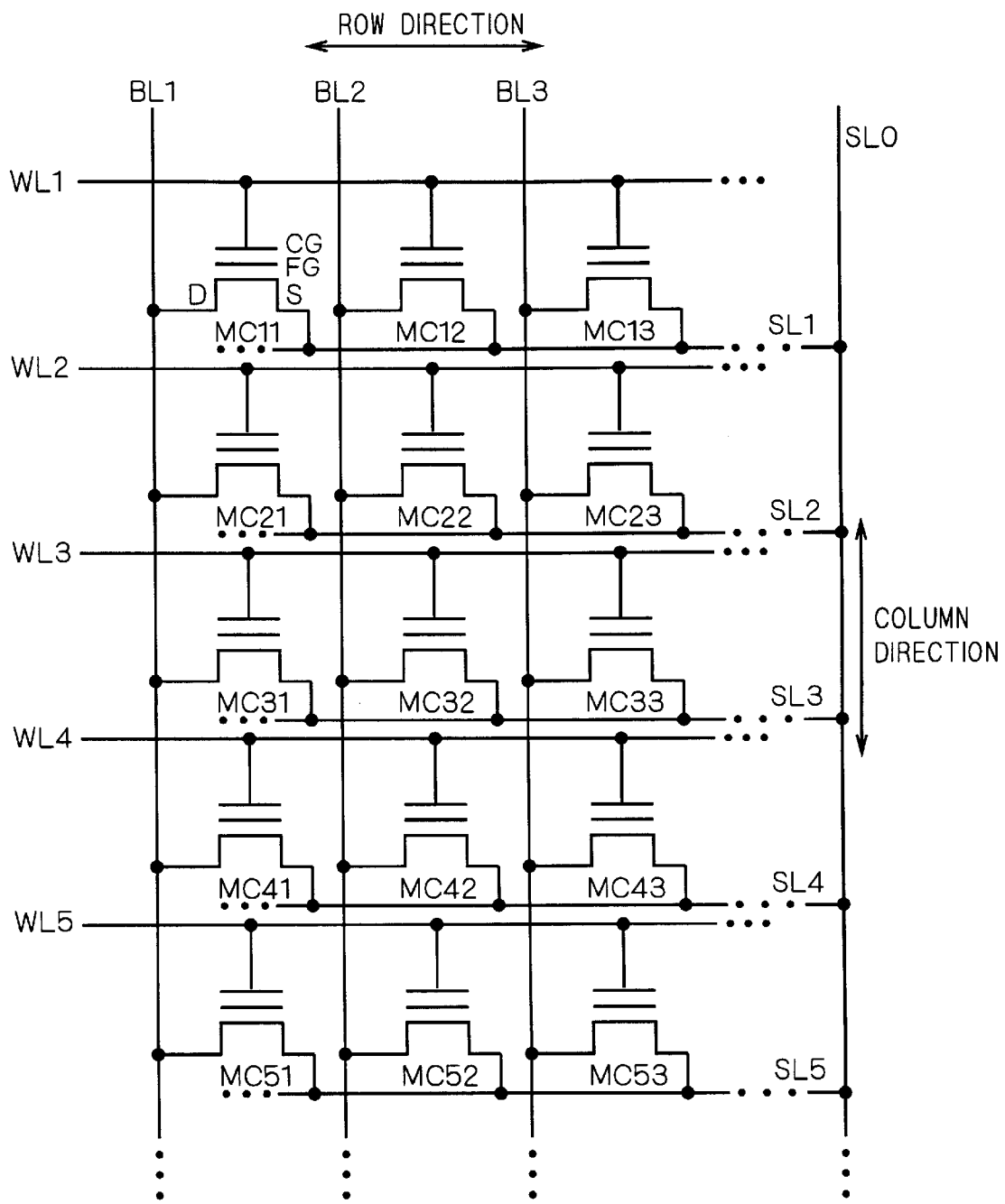
FIG. 2 is a circuit diagram showing part of a configuration of a memory cell array in the nonvolatile semiconductor memory device in accordance with the first preferred embodiment of the present invention.

FIG. 2 is a circuit diagram showing part of a configuration of a memory cell array in the flash memory. FIG. 2 shows the configuration consisting of only fifteen memory cells in a matrix with five rows and three columns. The "row" of the memory cell array refers to a "row" in a case where a direction perpendicular to that in which the source region and the drain region of the memory cell transistor are aligned is defined as "a row direction", with reference to FIG. 3 discussed later. Further, the "column" of the memory cell array refers to a "column" in a case where the direction in which the source region and the drain region of the memory cell transistor are aligned is defined as "a column direction", with reference to FIG. 3 discussed later. Each memory cell has a memory cell transistor shown in FIG. 1. The control gates CG of the memory cell transistors in the memory cells belonging to a row are connected to a common word line. For example, the control gates CG of the memory cell transistors in the memory cells MC11 to MC13 are connected in common to a word line WL1.

Further, sources S of the memory cell transistors in the memory cells belonging to a row are connected to a common source line. For example, the sources S of the memory cell transistors in the memory cells MC11 to MC13 are connected in common to a source line SL1. Respective source lines SL1 to SL5 in the rows are connected to a common source line SL0.

Furthermore, drains D of the memory cell transistors in the memory cells belonging to a column are connected to a common bit line. For example, the drains D of the memory cell transistors in the memory cells MC11 to MC51 are connected in common to a bit line BL1.

FIG. 3 is a plan view showing a structure of the nonvolatile semiconductor memory device having the configuration of the memory cell array of FIG. 2 in accordance with the first preferred embodiment of the present invention. In FIG. 3, an arrangement of the floating gate, the word line (also used as the control gate), the source line and the isolation insulating film is schematically shown. For example, floating gates 711, 712, and 721 shown in FIG. 3 correspond to the respective floating gates FG in the memory cell transistors of the memory cells MC11, MC12, MC21 shown in FIG. 2.

Further, for example, a source region Sa shown in FIG. 3 corresponds to the respective sources S in the memory cell transistors of the memory cells MC11 and MC21 shown in FIG. 2, and a source region Sd shown in FIG. 3 corresponds to the respective sources S in the memory cell transistors of the memory cells MC31 and MC41 shown in FIG. 2.

Furthermore, for example, a drain region Da shown in FIG. 3 corresponds to the respective drains D in the memory cell transistors of the memory cells MC21 and MC31 shown in FIG. 2, and a drain region Dd shown in FIG. 3 corresponds to the respective drains D in the memory cell transistors of the memory cells MC41 and MC51 shown in FIG. 2.

Referring to FIG. 3, the source lines SL1 and SL2 include the source regions Sa to Sc, the source lines SL3 and SL4 include the source regions Sd to Sf, and the source line SL5 includes the source regions Sg to Si. The isolation insulating film 5 is formed extending like a strip between the columns so as to isolate the memory cells belonging to the different columns. In FIG. 3, a region where the isolation insulating film 5 is formed is hatched.

All the source regions belonging to a row are electrically connected to one another through the silicon layer 4 in a portion between the bottom surface of the isolation insulating film 5 and the upper surface of the BOX layer 3. For example, the source regions Sa to Sc are electrically connected to one another through the silicon layer 4 in the above portion, thereby constituting the source lines SL1 and SL2 extending like strips in the row direction.

Figure 49:
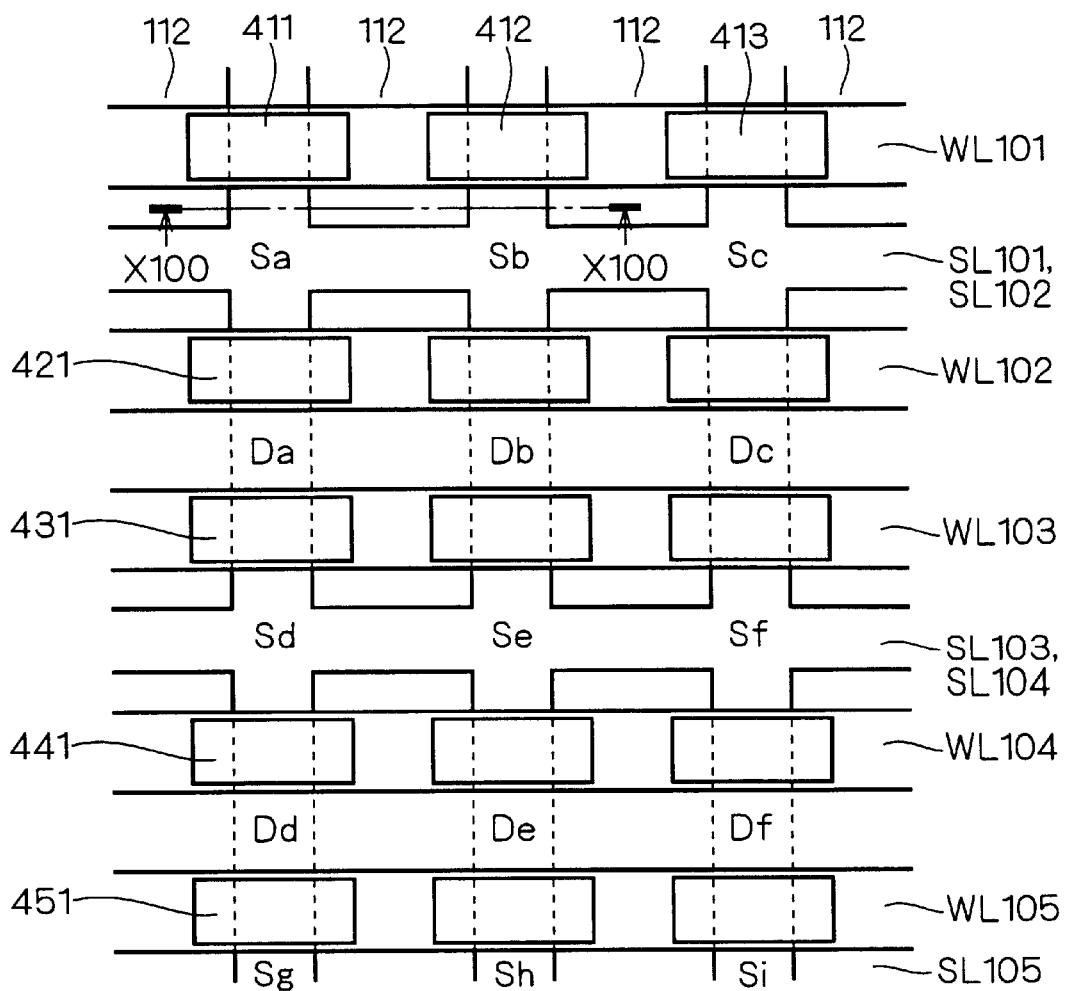
FIG. 49 is a plan view showing a structure of the nonvolatile semiconductor memory device in the background art.
Figure 50:
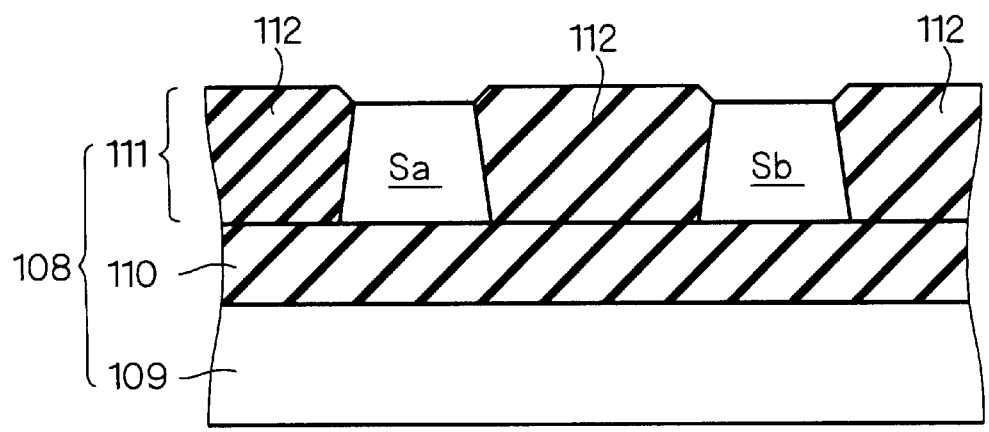
FIG. 50 is a cross section showing a cross-sectional structure taken along the line X100 of FIG. 49.

Thus, in the nonvolatile semiconductor memory device in accordance with the first preferred embodiment, the source regions adjacent to each other in the row direction are electrically connected to one another through the silicon layer 4 in the portion between the bottom surface of the partial-isolation insulating film 5 and the upper surface of the BOX layer 3, thereby constituting the source lines SL1 to SL5. Accordingly, since it is not necessary to provide a region where no isolation insulating film 5 is formed between the rows in order to form the source lines SL1 to SL5, it is possible to reduce an area of the memory cell array portion as compared with the background-art nonvolatile semiconductor memory device shown in FIG. 49.

Figure 4:
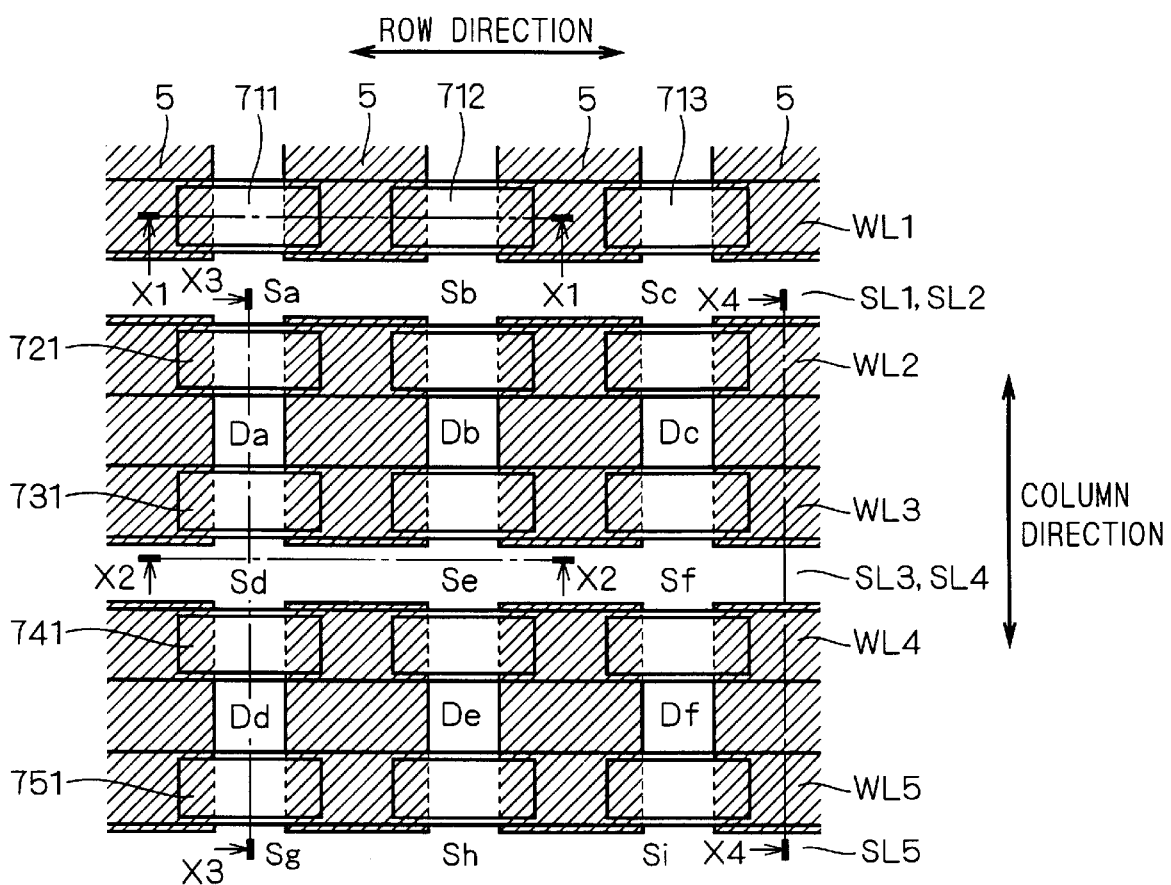
FIG. 4 is a plan view showing a structure of a nonvolatile semiconductor memory device in accordance with a variation of the first preferred embodiment of the present invention.

FIG. 4 is a plan view showing a structure of a nonvolatile semiconductor memory device in accordance with a variation of the first preferred embodiment of the present invention, correspondingly to FIG. 3. The nonvolatile semiconductor memory device of FIG. 4 has a basic structure of the nonvolatile semiconductor memory device of FIG. 3, and further the isolation insulating film 5 between the adjacent source regions (e.g., the source regions Sa and Sb) in the row direction is removed and the removed portion is used as a window for impurity implantation. In the silicon layer 4 of the portion which is exposed by removing the isolation insulating film 5, an impurity introduction region 10 discussed later is formed.

Figure 5:
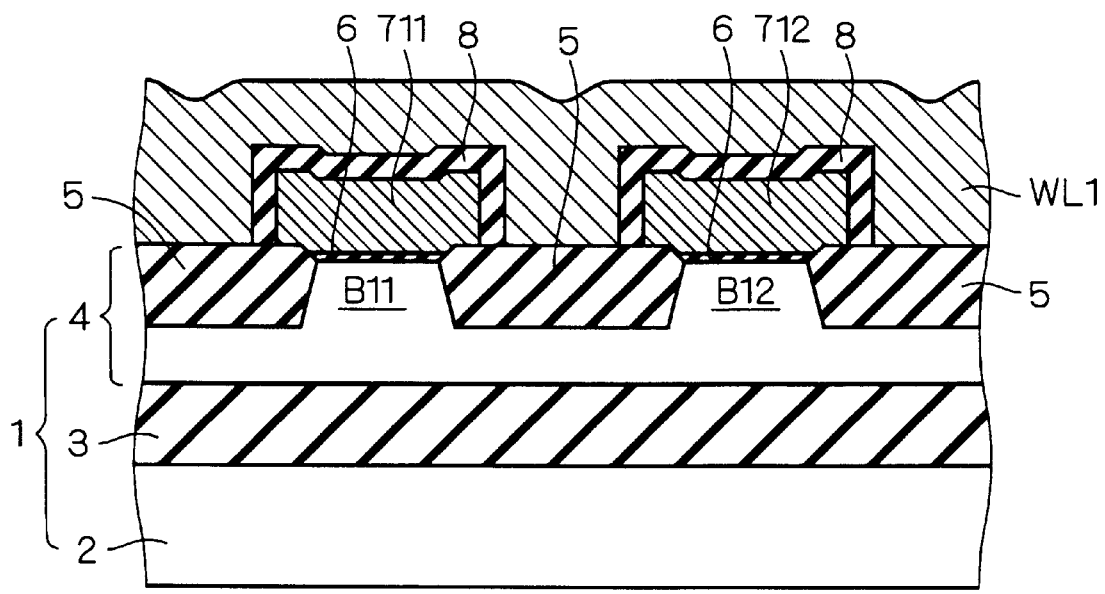
FIG. 5 is a cross section showing a cross-sectional structure taken along the line X1 of FIG. 4.

FIGS. 5 to 8 are cross sections showing cross-sectional structures taken along the lines X1 to X4 of FIG. 4, respectively. Referring to FIG. 5, the body regions B11 and B12 are electrically connected to each other through the silicon layer 4 in the portion between the bottom surface of the partial-isolation insulating film 5 and the upper surface of the BOX layer 3. As a result, potentials of the body regions B11 and B12 can be fixed to the same one by externally applying a voltage to the silicon layer 4, Referring to FIG. 6, in the upper surface of the silicon layer 4 between the source regions Sd and Se, a recess is formed by removing the isolation insulating film 5. In the silicon layer 4 between the source regions Sd and Se at the portion exposed by removing the isolation insulating film 5, the impurity introduction region 10 having the same conductivity type as the source regions Sd and Se have is formed.

Figure 8:
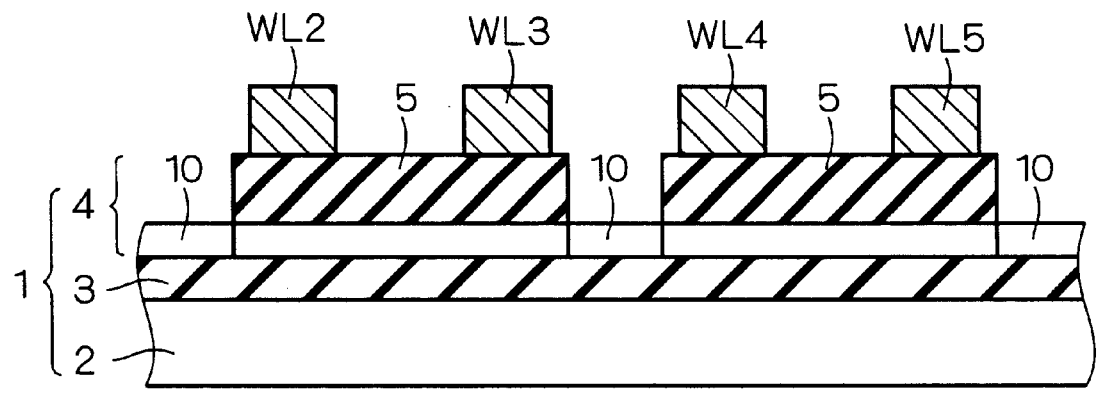
FIG. 8 is a cross section showing a cross-sectional structure taken along the line X4 of FIG. 4.

Referring to FIG. 8, the isolation insulating film 5 between the word lines WL3 and WL4 is removed. In the silicon layer 4 of the portion exposed by removing the isolation insulating film 5, the impurity introduction region 10 is formed.

To obtain the impurity introduction region 10, the memory cell transistor is first formed, the isolation insulating film 5 is removed to form the above recess, and then the impurity having the same conductivity type as the source region has is implanted from a bottom surface of the above recess into the silicon layer 4 through an ion implantation method. Further, as shown in FIGS. 6 and 8, the isolation insulating film 5 may be completely removed so as to expose the silicon layer 4 therebetween or may be partially removed.

Figure 6:
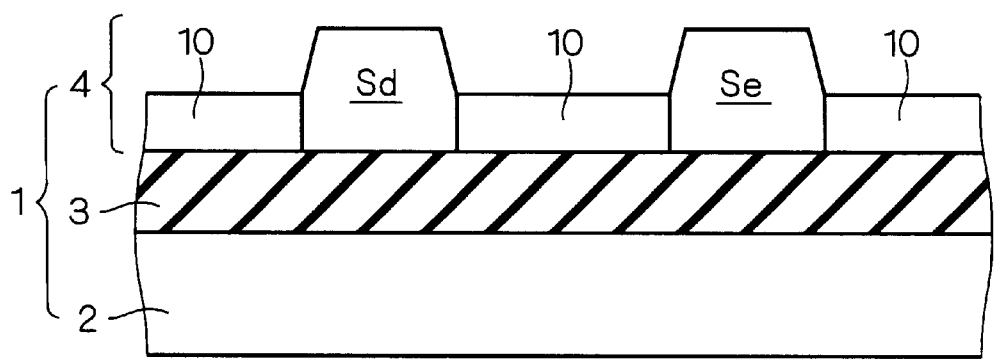
FIG. 6 is a cross section showing a cross-sectional structure taken along the line X2 of FIG. 4.

As shown in FIGS. 6 and 8, it is desirable to form the impurity introduction region 10 so that its bottom surface should reach the upper surface of the BOX layer 3. Since this makes it possible to avoid generation of pn junction capacitance between the bottom surface of the impurity introduction region 10 and the silicon layer 4 and reduce parasitic capacitance in the source line, an operation can be achieved at higher speed and lower power consumption.

Figure 7:
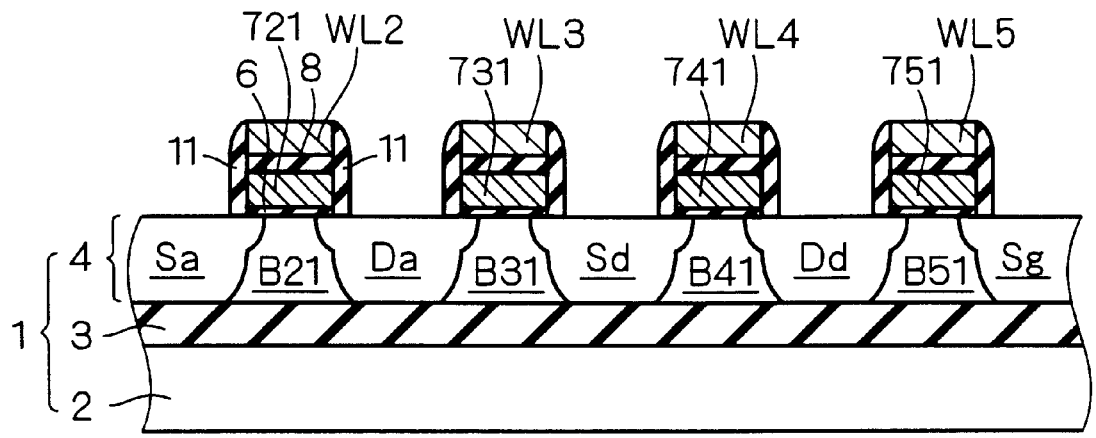
FIG. 7 is a cross section showing a cross-sectional structure taken along the line X3 of FIG. 4.

Referring to FIG. 7, the source regions Sa, Sd and Sg and the drain regions Da and Dd reach the upper surface of the BOX layer 3. The state where "the source region and the drain region reach the upper surface of the BOX layer" includes both a state where impurity diffusion regions of the source region and the drain region reach the upper surface of the BOX layer (FIG. 7) and a state where depletion layers in pn junctions between the source region and the silicon layer and between the drain region and the silicon layer reach the upper surface of the BOX layer. This also applies to the following in the present specification. Since the pn junction capacitances generated between the source region and the silicon layer 4 and between the drain region and the silicon layer 4 can be reduced and the parasitic capacitance in the source line can be reduced by forming the source region and the drain region so as to reach the upper surface of the BOX layer 3, an operation can be achieved at higher speed and lower power consumption.

Thus, in the nonvolatile semiconductor memory device in accordance with the variation of the first preferred embodiment, the impurity introduction region 10 having the same conductivity type as the source region has is formed in the silicon layer 4 between the adjacent source regions in the row direction. Therefore, it is possible to reduce the resistances of the source lines SL1 to SL5.

The Second Preferred Embodiment

In the above nonvolatile semiconductor memory device of the first preferred embodiment, as shown in FIG. 7, the source region and the drain region of the memory cell transistor are formed so deep as to reach the upper surface of the BOX layer 3. As shown in FIG. 7, however, since a body region B21, for example, is sandwiched horizontally by the source region Sa and the drain region Da, the width of the drain region Da in the channel length direction becomes narrower and consequently the body resistance rises in a direction perpendicular to the drawing paper of FIG. 7 (see to the document 1: "Bulk-Layout-Compatible 0.18 µm SOI-CMOS Technology Using Body-Fixed Partial Trench Isolation (PTI), Y. Hirano et al., 1999 IEEE International SOI Conference, Oct. 1999, p. 131). In the second preferred embodiment of the present invention, a nonvolatile semiconductor memory device which can avoid this drawback will be proposed. Further, the whole disclosure of the document 1 is herein incorporated by reference in the present specification.

FIG. 9 is a cross section showing a structure of a nonvolatile semiconductor memory device in accordance with the second preferred embodiment of the present invention. FIG. 9 is an enlarged view showing only one memory cell transistor correspondingly to FIG. 7. The source region S and the drain region D of the memory cell transistor are formed so shallow as not to reach the upper surface of the BOX layer 3. Such source region S and drain region D as not to reach the upper surface of the BOX layer 3 are formed by implanting As ions (in the case of NMOS) at an energy of 8 keV at a dose of $4 \times 10^{15}/cm^2$, for example, when the film thickness of the silicon layer 4 is 150 nm.

FIG. 10 is a cross section showing a structure of the nonvola tile semiconductor memory device in accordance with the second preferred embodiment of the present invention, correspondingly to FIG. 6. The source region S is so formed as not to reach the upper surface of the BOX layer 3 while the impurity introduction region 10 is so formed as to reach the upper surface of the BOX layer 3 like in the first preferred embodiment.

Thus, in the nonvolatile semiconductor memory device of the second preferred embodiment, since the source region S and the drain region D of the memory cell transistor are so formed as not to reach the upper surface of the BOX layer 3, it is possible to avoid the rise in body resistance in a direction perpendicular to the drawing paper of FIG. 9.

Further, referring to FIGS. 3 and 4, in the nonvolatile semiconductor memory device of the first preferred embodiment, the body potential can be fixed only through a region between the adjacent memory cells in the row direction. In contrast, in the nonvolatile semiconductor memory device of the second preferred embodiment, since there exists the silicon layer 4 between the respective bottom surfaces of the source region S and the drain region D and the upper surface of the BOX layer 3, the body potential can be fixed also through a region between the adjacent memory cells in the column direction. As a result, the capability of fixing the body potential is enhanced and the source-drain breakdown voltage can be further enhanced.

Moreover, as shown in FIG. 10, since the impurity introduction region 10 is so formed as to reach the upper surface of the BOX layer 3, it is possible to avoid generation of the pn junction capacitance between the impurity introduction region 10 and the silicon layer 4. Therefore, an increase in parasitic capacitance of the source line due to such formation of the source region and the drain region as not to reach the upper surface of the BOX layer 3 can be suppressed to the minimum.

The Third Preferred Embodiment

In the above nonvolatile semiconductor memory device of the first preferred embodiment, the pn junction capacitance on the drain side affects the read and write operations of data which are randomly accessed. Further, the pn junction capacitance on the source side affects an erase operation of data which are batched. These relations, however, vary depending on the cell structure, the writing and erasing methods and the configuration of the memory cell array (see to the document 2: "NIKKEI MICRODEVICES", Mar. 2000, pp. 74 and 75). The whole disclosure of the document 2 is herein incorporated by reference in the present specification.

Figure 11:
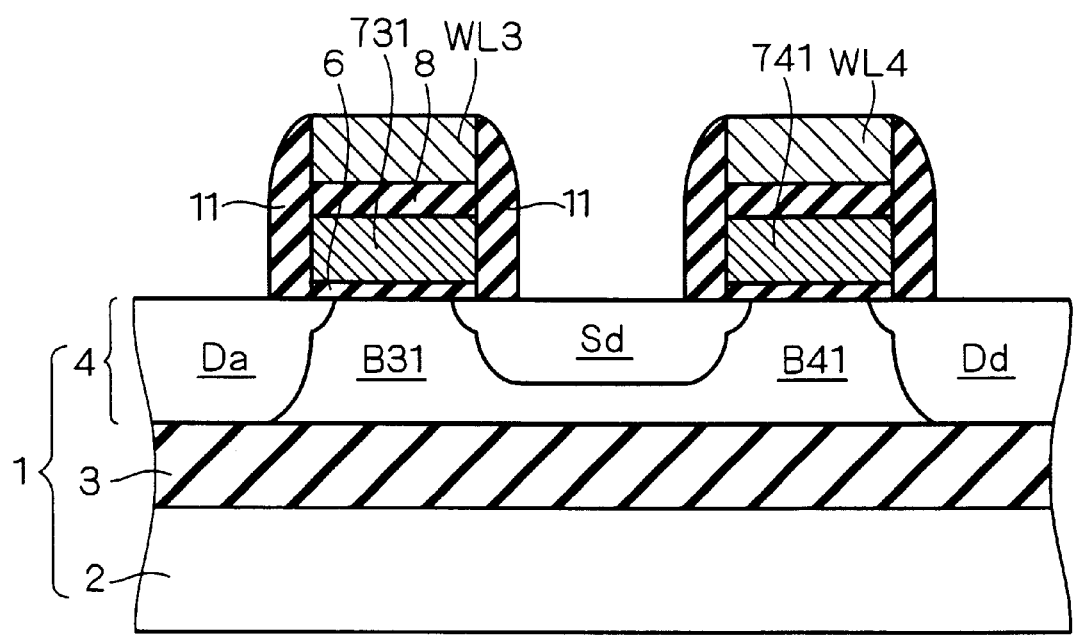
FIG. 11 is a cross section showing a structure of a nonvolatile semiconductor memory device in accordance with a third preferred embodiment of the present invention.

FIG. 11 is a cross section showing a structure of a nonvolatile semiconductor memory device in accordance with the third preferred embodiment of the present invention. FIG. 11 is an enlarged view showing the memory cell transistors in the memory cells MC31 and MC 41, correspondingly to FIG. 7. The drain regions Da and Dd are formed so deep as to reach the upper surface of the BOX layer 3 like in the first preferred embodiment. Such drain regions Da and Dd as to reach the upper surface of the BOX layer 3 are formed by implanting As ions (in the case of NMOS) at an energy of 50 keV at a dose of $4 \times 10^{15}/cm^2$, for example, when the film thickness of the silicon layer 4 is 150 nm. On the other hand, the source region Sd is formed so shallow as not to reach the upper surface of the BOX layer 3, like in the second preferred embodiment.

Further, also in the nonvolatile semiconductor memory device of the third preferred embodiment, the configuration of the memory cell array can have the same layout as shown in FIG. 4. In this case, the configuration of the source lines has the layout shown in FIG. 10.

Thus, in the nonvolatile semiconductor memory device of the third preferred embodiment, it is possible to maintain the read and write operations of data at high speed and low power consumption by forming the drain region so as to reach the upper surface of the BOX layer 3 while the capability of fixing the body potential can be enhanced by forming the source region so as not to reach the upper surface of the BOX layer 3.

FIG. 12 is a plan view showing a structure of a nonvolatile semiconductor memory device in accordance with a variation of the third preferred embodiment of the present invention. FIG. 12 schematically shows an arrangement of the floating gate, the word line (also used as the control gate), the source line and the isolation insulating film. Like the layout of the memory cell array shown in FIG. 49, the regions where no isolation insulating film 5 is formed are each formed between the rows, and the source lines SL1 to SL5 are formed in the regions. In this case, the source lines SL1 to SL5 are formed so shallow as not to reach the upper surface of the BOX layer 3. In other words, there exists the silicon layer 4 between the bottom surfaces of the source lines SL1 to SL5 and the upper surface of the BOX layer 3.

In the nonvolatile semiconductor memory device in accordance with the variation of the third preferred embodiment, it is possible to mutually fix the potentials of the body regions adjacent to each other with the source lines SL1 to SL5 interposed therebetween in the column direction through the silicon layer 4 in the portion between the bottom surfaces of the source lines SL1 to SL5 and the upper surface of the BOX layer 3. Therefore, the layout of FIG. 12 is so much superior in capability of fixing the body potential, though inferior in reduction of area of the memory cell array portion, to the layouts shown in FIGS. 3 and 4. Therefore, it is desirable to use the layout of FIG. 12 in the flash memory which needs a high source-drain breakdown voltage, e.g., for a large number of rewrite operations. Also in the nonvolatile semiconductor memory device using the layout of FIG. 12, since the drain region is so formed as to reach the upper surface of the BOX layer 3, it is possible to maintain the read and write operations of data at high speed and low power consumption.

The Fourth Preferred Embodiment

Figure 13:
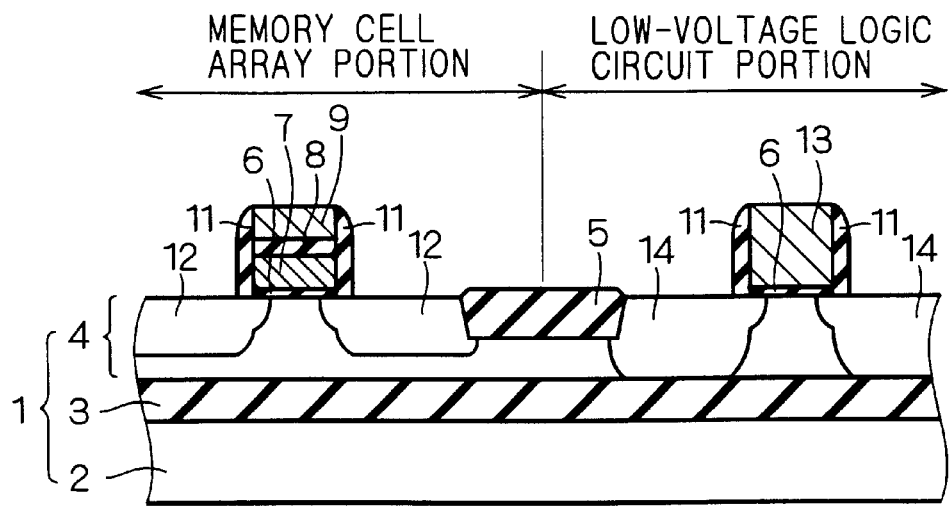
FIG. 13 is a cross section showing a structure of a semiconductor integrated circuit in accordance with a fourth preferred embodiment of the present invention.

FIG. 13 is a cross section showing a structure of a semiconductor integrated circuit in accordance with the fourth preferred embodiment of the present invention. The SOI substrate 1 has a memory cell array portion in which the memory cell array of flash memory is formed and a low-voltage logic circuit portion in which a low-voltage logic circuit operating with a voltage lower than an operating voltage of the flash memory is formed. Specifically, in the low-voltage logic circuit portion, peripheral circuits of the flash memory itself and other logic circuits used in combination with the flash memory are formed.

The memory cell array portion and the low-voltage logic circuit portion are isolated from each other by the partial-isolation insulating film 5 formed in the upper surface of the silicon layer 4. Further, the film thickness of the silicon layer 4 in the memory cell array portion and that of the silicon layer 4 in the low-voltage logic circuit portion are equal to each other.

In the upper surface of the silicon layer 4 of the memory cell array portion formed are source/drain regions 12 which are paired away from each other. Further, on the upper surface of the silicon layer 4 in a portion between the source/drain regions 12 formed is a multilayer structure in which the gate oxide film 6, the floating gate 7, the insulating film 8 and the control gate 9 are layered in this order. On a side surface of the multilayer structure, the sidewall 11 is formed, constituting a gate electrode structure. The source/drain regions 12 do not reach the upper surface of the BOX layer 3, like in the second preferred embodiment. There may be a case, however, where the drain region reaches the upper surface of the BOX layer 3 and only the source region does not reach the upper surface of the BOX layer 3, like in the third preferred embodiment.

On the other hand, in the upper surface of the silicon layer 4 of the low-voltage logic circuit portion formed are source/drain regions 14 which are paired away from each other. Further, on the upper surface of the silicon layer 4 in a portion between the source/drain regions 14 formed is a multilayer structure in which the gate oxide film 6 and a gate electrode 13 are layered in this order. On a side surface of the multilayer structure, the sidewall 11 is formed, constituting a gate electrode structure. Both of the source/drain regions 14 are so formed as to reach the upper surface of the BOX layer 3.

Thus, in the semiconductor integrated circuit of the fourth preferred embodiment, the source/drain regions 12 are so formed as not to reach the upper surface of the BOX layer 3 like in the second preferred embodiment or only the source region is so formed as not to reach the upper surface of the BOX layer 3 like in the third preferred embodiment in the memory cell array portion, while both the source/drain regions 14 are so formed as to reach the upper surface of the BOX layer 3 in the low-voltage logic circuit portion. Therefore, the effect of the nonvolatile semiconductor memory devices in the second and third preferred embodiments can be produced in the memory cell array portion while it is possible to avoid a decrease in operation speed and an increase in power consumption which are caused as the capacitance of the pn junction constituted of the source/drain regions 14 and the silicon layer 4 increases in the low-voltage logic circuit portion.

The Fifth Preferred Embodiment

Figure 14:
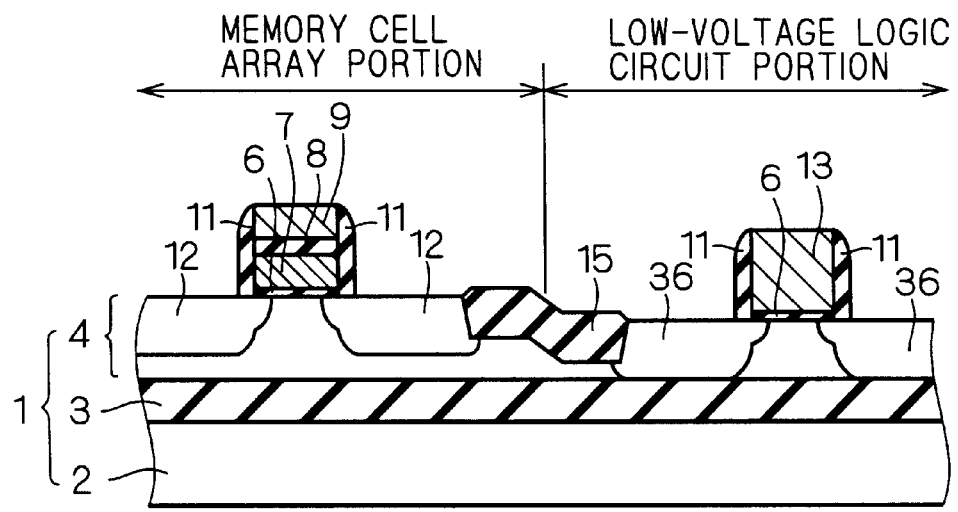
FIG. 14 is a cross section showing a structure of a semiconductor integrated circuit in accordance with a fifth preferred embodiment of the present invention.

FIG. 14 is a cross section showing a structure of a semiconductor integrated circuit in accordance with the fifth preferred embodiment of the present invention. Like in the fourth preferred embodiment, the SOI substrate 1 has the memory cell array portion and the low-voltage logic circuit portion. The film thickness of the silicon layer 4 in the low-voltage logic circuit portion is thinner than that of the silicon layer 4 in the memory cell array portion. Further, the memory cell array portion and the low-voltage logic circuit portion are isolated from each other by a partial-isolation insulating film 15 formed in the upper surface of the silicon layer 4.

In the memory cell array portion, the memory cell transistor like that in the fourth preferred embodiment is formed. Further, on the upper surface of the silicon layer 4 of the low-voltage logic circuit portion, the gate electrode structure like that in the fourth preferred embodiment is formed. In the silicon layer 4 of the low-voltage logic circuit portion, source/drain regions 36 are so formed as to reach the upper surface of the BOX layer 3. The depth from the upper surface of the silicon layer 4 to the bottom surface of the source/drain regions 12 is equal to that from the upper surface of the silicon layer 4 to the bottom surface of the source/drain regions 36.

The structure shown in FIG. 14 is obtained by performing a step (a) of preparing the SOI substrate 1 in which the silicon layer 4 has a film thickness of, e.g., 200 nm, a step (b) of etching the silicon layer 4 in the low-voltage logic circuit portion from its upper surface by a thickness of 100 nm, a step (c) of forming the isolation insulating film 15, a step (d) of forming the gate electrode structures both in the memory cell array portion and the low-voltage logic circuit portion and a step (e) of implanting As ions (in the case of NMOS) at an energy of 50 keV at a dose of $4 \times 10^{15}/cm^2$ in this order.

Thus, in the semiconductor integrated circuit of the fifth preferred embodiment, the effect of the nonvolatile semiconductor memory devices in the second and third preferred embodiments can be produced in the memory cell array portion while it is possible to avoid a decrease in operation speed and an increase in power consumption which are caused as the capacitance of the pn junction constituted of the source/drain regions 36 and the silicon layer 4 increases in the low-voltage logic circuit portion, like in the fourth preferred embodiment.

Moreover, since the silicon layer 4 in the low-voltage logic circuit portion is made thinner in advance, the source/drain regions 12 which do not reach the upper surface of the BOX layer 3 and the source/drain regions 36 which reach the upper surface of the BOX layer 3 are formed through the same step (e) of ion implantation.

The Sixth Preferred Embodiment

Figure 15:
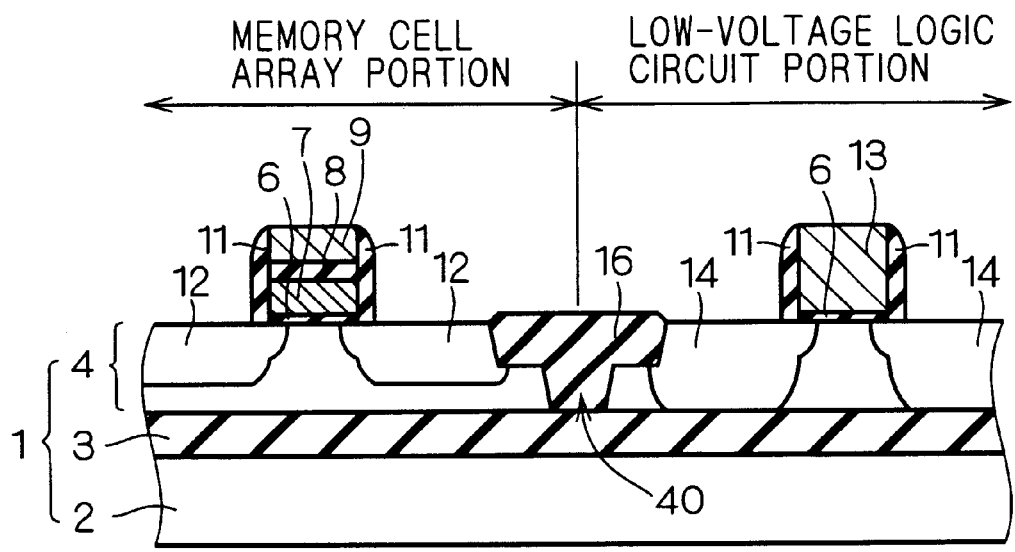
FIG. 15 is a cross section showing a structure of a semiconductor integrated circuit in accordance with a sixth preferred embodiment of the present invention.

FIG. 15 is a cross section showing a structure of a semiconductor integrated circuit in accordance with the sixth preferred embodiment of the present invention. The semiconductor integrated circuit of the sixth preferred embodiment has a basic structure of the semiconductor integrated circuit of the fourth preferred embodiment shown in FIG. 13 and an isolation insulating film 16 is formed, instead of the isolation insulating film 5, in an interface between the memory cell array portion and the low-voltage logic circuit portion. The isolation insulating film 16 has a full isolation portion 40 reaching the upper surface of the BOX layer 3 at part of its bottom surface.

Figure 16:
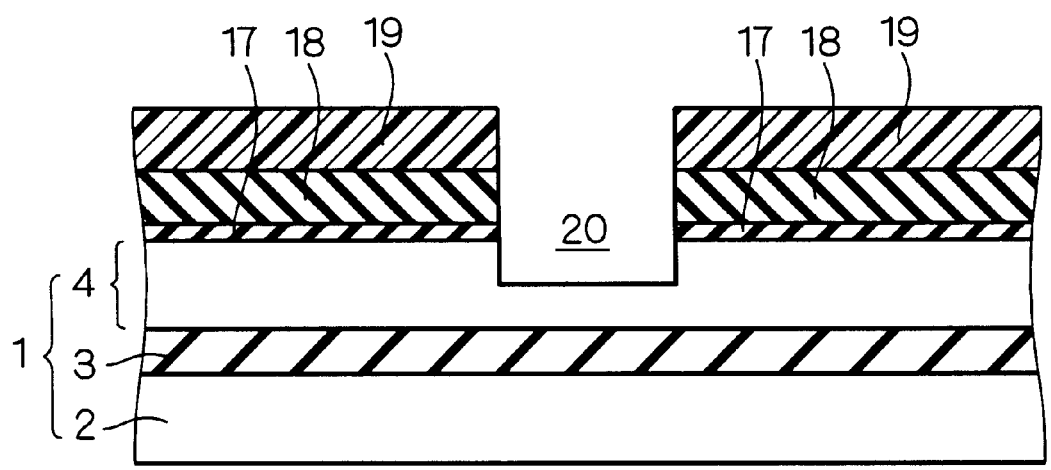
FIGS. 16 to 19 are cross sections showing a first method of manufacturing an isolation insulating film in the semiconductor integrated circuit in accordance with the sixth preferred embodiment of the present invention step by step.

FIGS. 16 to 19 are cross sections showing the first method of manufacturing the isolation insulating film 16 step by step (Japanese Patent Application No. 10-367265 (1998)). First, on the upper surface of the silicon layer 4, an oxide film 17 and a nitride film 18 are entirely formed in this order. Subsequently, a photoresist 19 having an opening pattern above a region where the isolation insulating film 16 is to be formed is formed on an upper surface of the nitride film 18. Then, with the photoresist 19 used as a mask, the nitride film 18, the oxide film 17 and the silicon layer 4 are etched in this order, to form a recess 20. At this time, part of the silicon layer 4 is left between the bottom surface of the recess 20 and the upper surface of the BOX layer 3 (FIG. 16).

Figure 17:
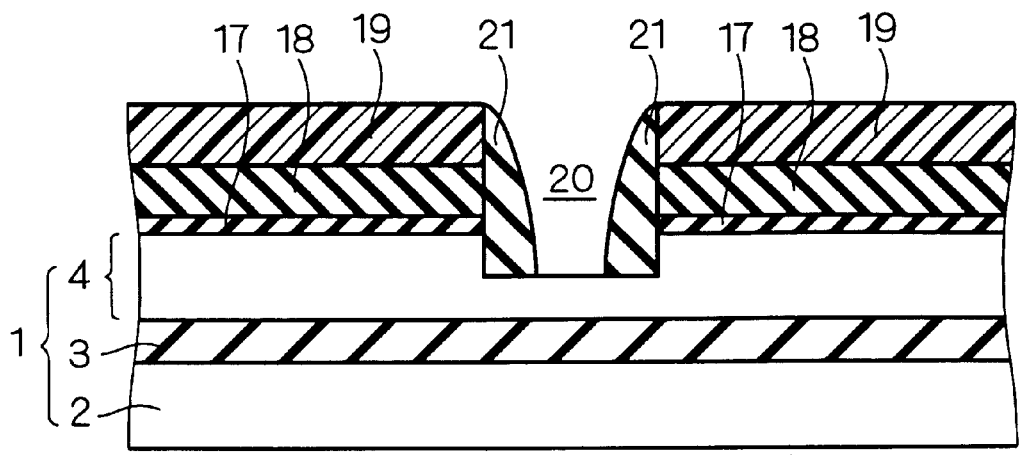
Figure 18:
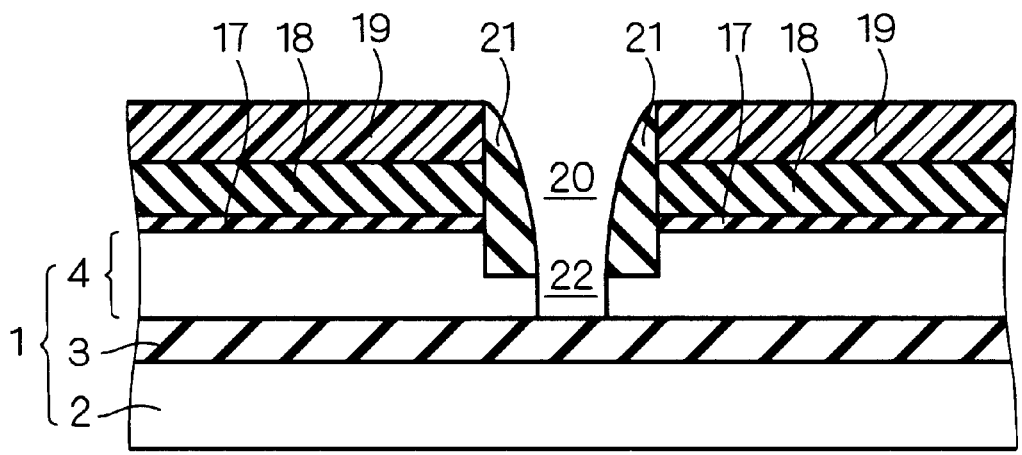
Figure 19:
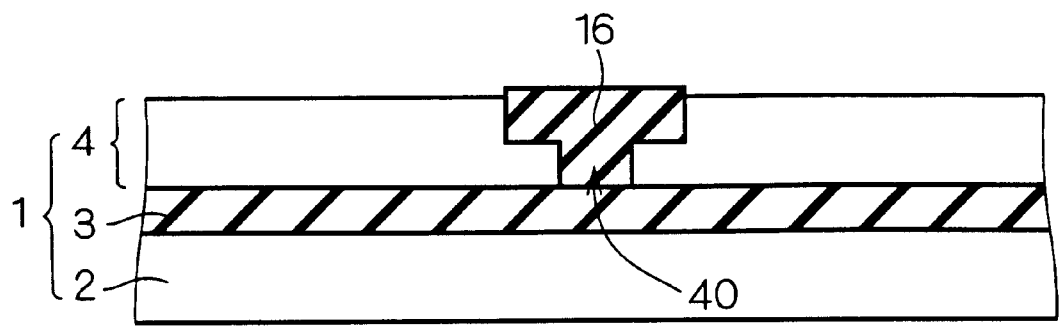

Next, on a side surface of the recess 20, a sidewall 21 made of the insulating film is formed (FIG. 17). As shown in FIG. 17, a central portion of the bottom surface of the recess 20 is exposed from the sidewall 21. Subsequently, with the sidewall 21 and the photoresist 19 used as a mask, the silicon layer 4 is etched so as to expose the upper surface of the BOX layer 3, to form a recess 22 (FIG. 18). Then, after filling the recesses 20 and 22 with the insulating film, the whole structure is polished by the CMP method to such an extent that the bottom part of the nitride film 18 is left, and after that, the remaining nitride film 18 and the oxide film 17 are removed, to form the isolation insulating film 16 having the full isolation portion 40 (FIG. 19).

Figure 20:
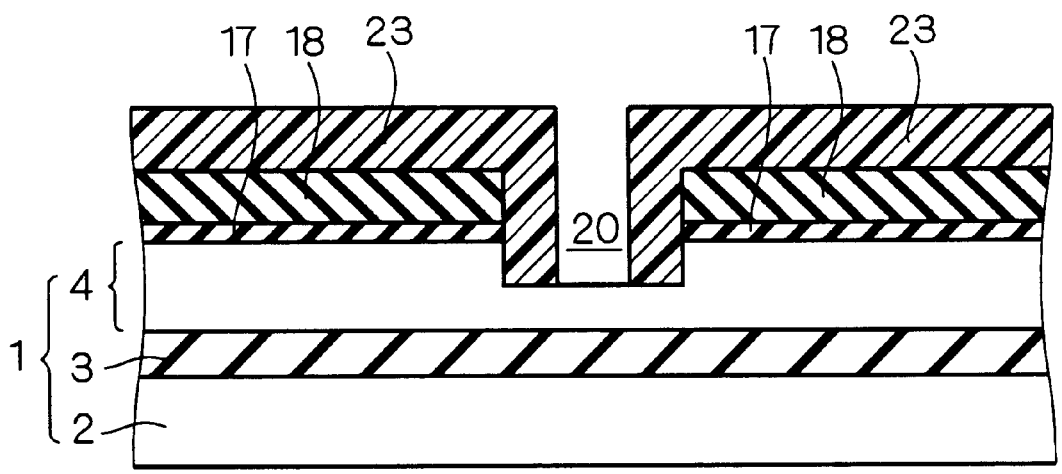
FIGS. 20 and 21 are cross sections showing a second method of manufacturing an isolation insulating film in the semiconductor integrated circuit in accordance with the sixth preferred embodiment of the present invention step by step.
Figure 21:
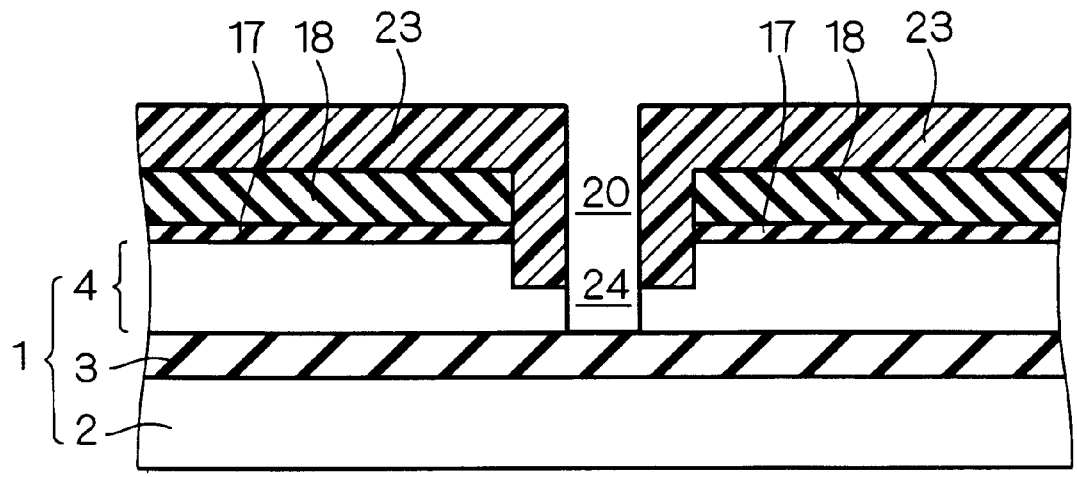

FIGS. 20 and 21 are cross sections showing the second method of manufacturing the isolation insulating film 16 step by step (Japanese Patent Application No. 10-367265 (1998)). First, after the structure of FIG. 16 is obtained, the photoresist 19 is removed. Subsequently, a photoresist 23 having an opening pattern above a region where the full isolation portion 40 is to be formed is formed (FIG. 20). Then, with the photoresist 23 used as a mask, the silicon layer 4 is etched so as to expose the upper surface of the BOX layer 3, to form a recess 24 (FIG. 21).

Next, after removing the photoresist 23, the insides of the recesses 20 and 24 are filled with the insulating film. Then, the whole structure is polished by the CMP method to such an extent that the bottom part of the nitride film 18 is left, and after that, the remaining nitride film 18 and the oxide film 17 are removed, to form the isolation insulating film 16 having the full isolation portion 40 like in FIG. 19.

Figure 22:
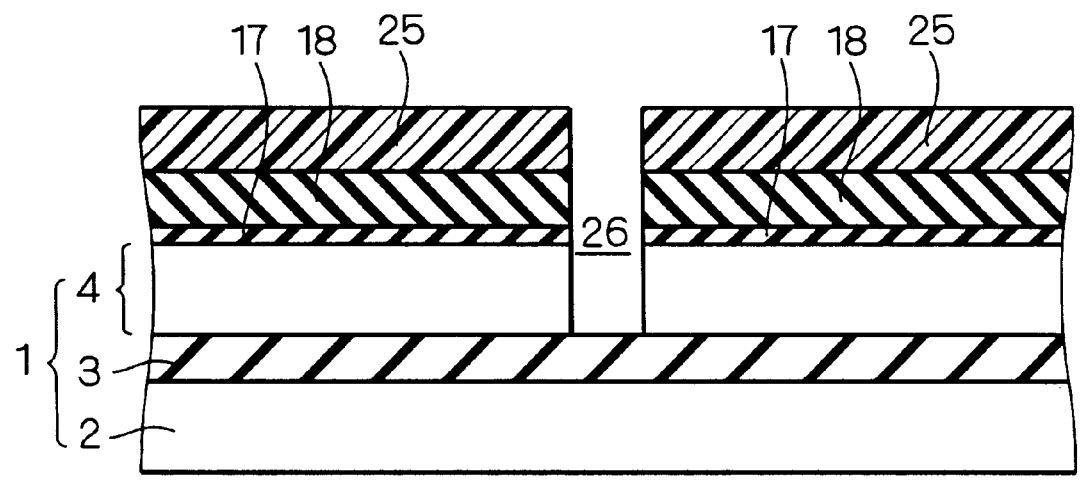
FIGS. 22 to 24 are cross sections showing a third method of manufacturing an isolation insulating film in the semi-conductor integrated circuit in accordance with the sixth preferred embodiment of the present invention step by step.
Figure 23:
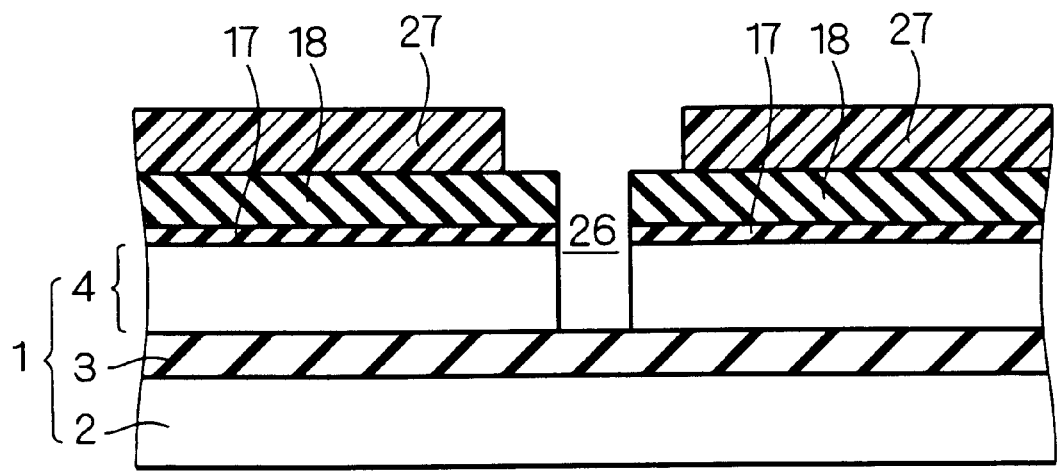
Figure 24:
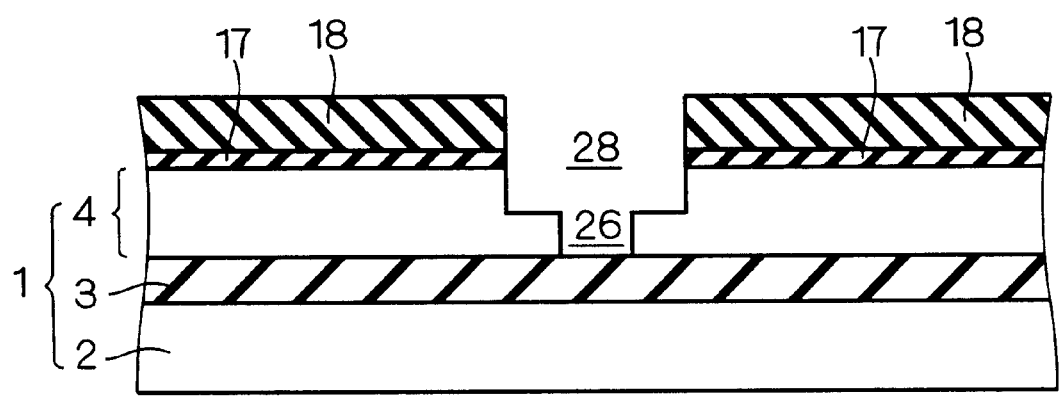

FIGS. 22 to 24 are cross sections showing the third method of manufacturing the isolation insulating film 16 step by step (Japanese Patent Application No. 11-177091 (1999)). First, on the upper surface of the silicon layer 4, the oxide film 17 and the nitride film 18 are entirely formed in this order. Subsequently, a photoresist 25 having an opening pattern above a region where the full isolation portion 40 is to be formed is formed on the upper surface of the nitride film 18. Then, with the photoresist 25 used as a mask, the nitride film 18, the oxide film 17 and the silicon layer 4 are etched in this order so as to expose the upper surface of the BOX layer 3, to form a recess 26 (FIG. 22).

Next, after removing the photoresist 25, a photoresist 27 having an opening pattern above the region where the isolation insulating film 16 is to be formed is formed on the upper surface of the nitride film 18 (FIG. 23). Subsequently, with the photoresist 27 used as a mask, the nitride film 18, the oxide film 17 and the silicon layer 4 are etched in this order, to form a recess 28. At this time, part of the silicon layer 4 is left between the bottom surface of the recess 28 and the upper surface of the BOX layer 3. After that, the photoresist 27 is removed (FIG. 24).

Next, after filling the recesses 26 and 28 with the insulating film, the whole structure is polished by the CMP method to such an extent that the bottom part of the nitride film 18 is left, and after that, the remaining nitride film 18 and the oxide film 17 are removed, to form the isolation insulating film 16 having the full isolation portion 40, like in FIG. 19.

Figure 25:
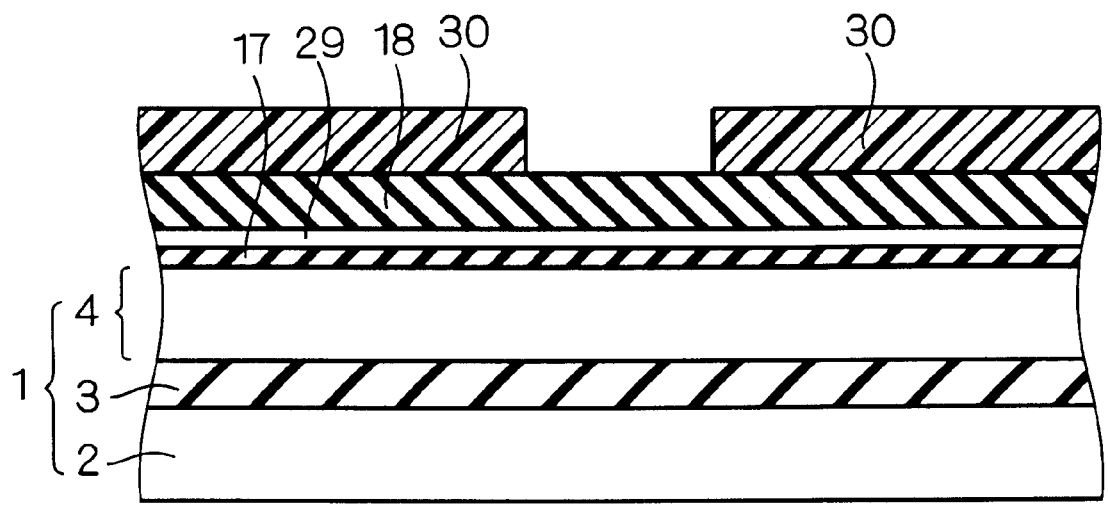
FIGS. 25 to 29 are cross sections showing a fourth method of manufacturing an isolation insulating film in the semiconductor integrated circuit in accordance with the sixth preferred embodiment of the present invention step by step.

FIGS. 25 to 29 are cross sections showing the fourth method of manufacturing the isolation insulating film 16 step by step (Japanese Patent Application Laid Open Gazette No. 2000-39484). First, on the upper surface of the silicon layer 4, the oxide film 17, a polysilicon film 29 and the nitride film 18 are entirely formed in this order. Subsequently, a photoresist 30 having an opening pattern above the region where the isolation insulating film 16 is to be formed is formed on the upper surface of the nitride film 18 (FIG. 25).

Figure 26:
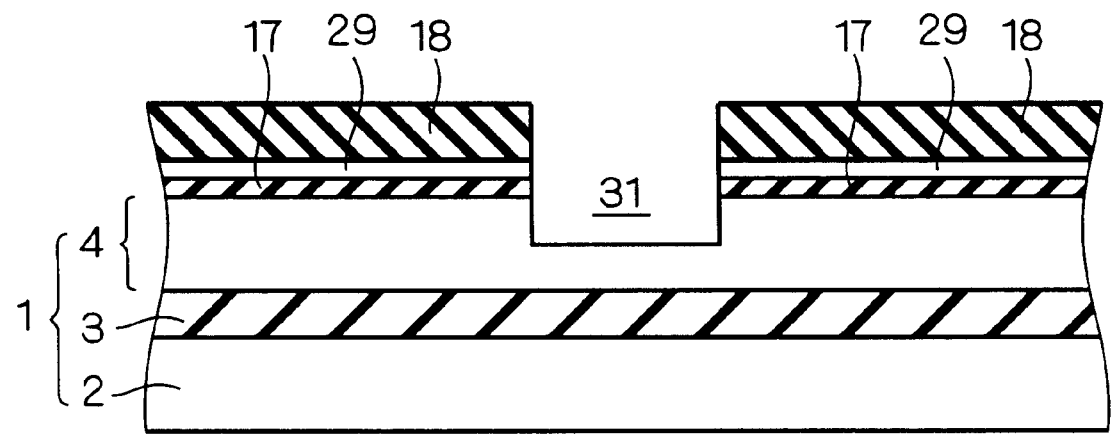

Next, with the photoresist 30 used as a mask, the nitride film 18, the polysilicon film 29, the oxide film 17 and the silicon layer 4 are etched in this order, to form a recess 31. At this time, part of the silicon layer 4 is left between the bottom surface of the recess 31 and the upper surface of the BOX layer 3. After that, the photoresist 30 is removed (FIG. 26).

Figure 27:
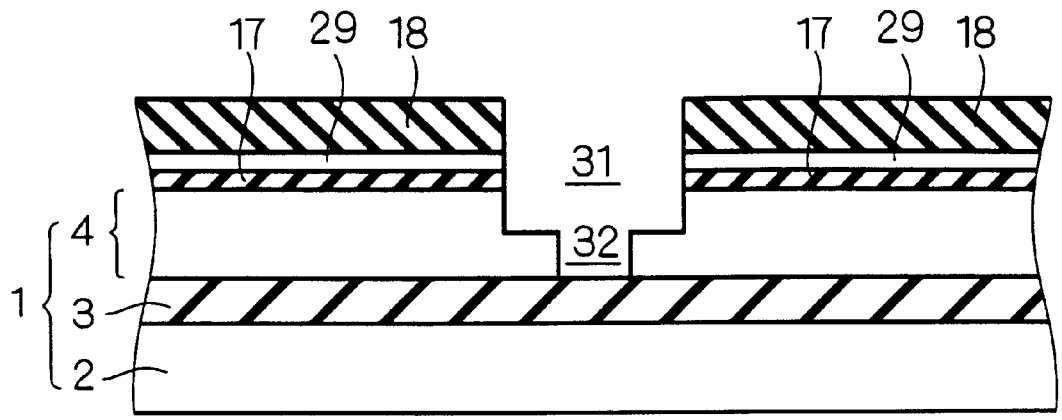

Next, like the second manufacturing method, with the photoresist 23 having, an opening pattern above a region where the full isolation portion 40 is to be formed used as a mask, the silicon layer 4 is etched so as to expose the upper surface of the BOX layer 3, to form a recess 32. After that, the photoresist 23 is removed (FIG. 27).

Figure 28:
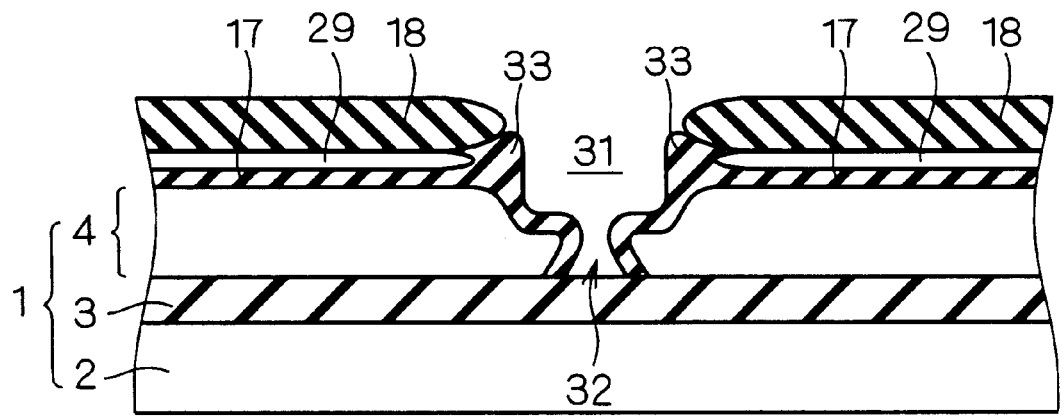

Next, an oxide film 33 is formed on side surfaces of the recesses 31 and 32 by wet oxidation under the temperature condition of 700° to 900° C. (FIG. 28). The oxide film 33 penetrates deep between the polysilicon film 29 and the oxide film 17 and between the oxide film 17 and the silicon layer 4. This makes the bird's beak shape of the oxide film 33 prominent.

Figure 29:
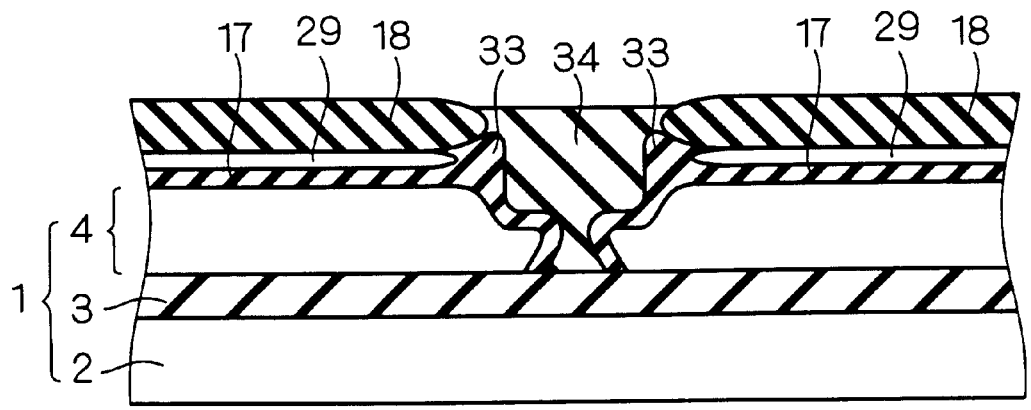

Next, after filling the insides of the recesses 31 and 32 with an oxide film 34, the silicon oxide film 34 is polished by the CMP method to such an extent that an upper surface of the oxide film 34 does not become too lower than the upper surface of the nitride film 18 (FIG. 29). Subsequently, the nitride film 18, the polysilicon film 29 and the oxide film 17 are removed, to form the isolation insulating film 16 having the full isolation portion 40, like in FIG. 19.

With respect to the above various methods of forming the partial-isolation insulating film partly having the full isolation portion, the present applicant has filed an U.S. application Ser. No. 09/466,934 with the date of Dec. 20, 1999 and an U.S. application Ser. No. 09/369,953 with the date of Aug. 17, 2000. The whole disclosure of first-filed applications is herein incorporated by reference in the present specification.

Figure 30:
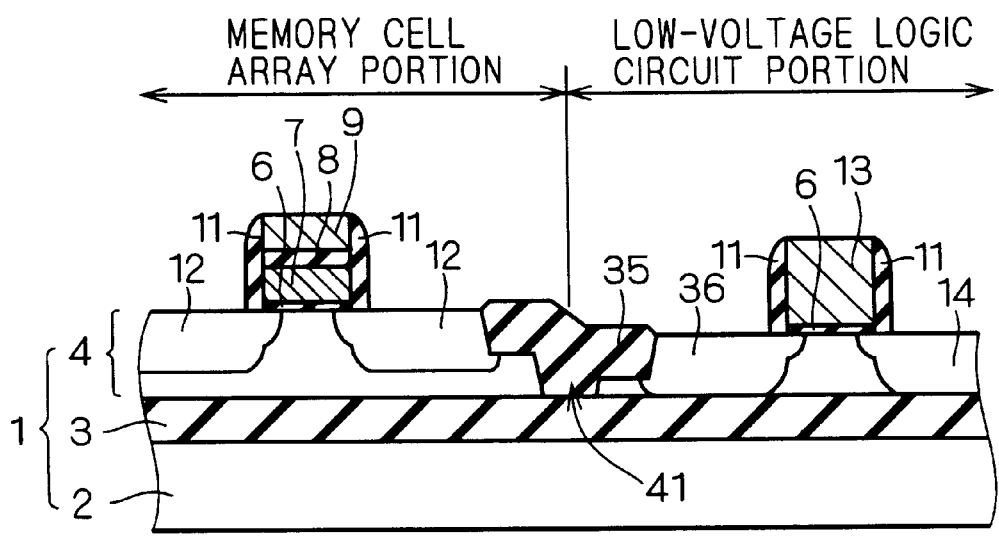
FIG. 30 is a cross section showing another structure of the semiconductor integrated circuit in accordance with the sixth preferred embodiment of the present invention.

Though the foregoing discussion has been made on the application of the invention in accordance with the sixth preferred embodiment to the basic structure of the semiconductor integrated circuit in accordance with the fourth preferred embodiment shown in FIG. 13, there may be an application of the invention in accordance with the sixth preferred embodiment to the basic structure of the semiconductor integrated circuit in accordance with the fifth preferred embodiment shown in FIG. 14. FIG. 30 is a cross section showing another structure of the semiconductor integrated circuit in accordance with the sixth preferred embodiment of the present invention with the semiconductor integrated circuit of the fifth preferred embodiment used as a basic structure. In the semiconductor integrated circuit of FIG. 30, an isolation insulating film 35 is formed, instead of the isolation insulating film 15 of FIG. 14, in the interface between the memory cell array portion and the low-voltage logic circuit portion. The isolation insulating film 35 has a full isolation portion 41 reaching the upper surface of the BOX layer 3 at part of its bottom surface.

FIGS. 31 to 34 are cross sections showing a method of manufacturing the semiconductor integrated circuit shown in FIG. 30 step by step. First, the SOI substrate 1 having the multilayer structure in which the silicon substrate 2, the BOX layer 3 and the silicon layer 4 are layered in this order is prepared (FIG. 31). Subsequently, the upper surface of the silicon layer 4 in the low-voltage logic circuit portion is thermally oxidized, to form a silicon oxide film (not shown). Since the thermal oxidation proceeds also inside the silicon layer 4, the bottom surface of the silicon oxide film exists at a position lower than the upper surface of the silicon layer 4 in the memory cell array portion. Then, the above silicon oxide film formed by the thermal oxidation is removed by etching. This makes the upper surface of the silicon layer 4 in the low-voltage logic circuit portion lower than the upper surface of the silicon layer 4 in the memory cell array portion (FIG. 32).

Next, through the same method as in the case of forming the isolation insulating film 16, the isolation insulating film 35 is formed in the interface between the memory cell array portion and the low-voltage logic circuit portion. Further, the partial-isolation insulating films 5 are formed in the memory cell array portion and the low-voltage logic circuit portion (FIG. 33).

Figure 34:
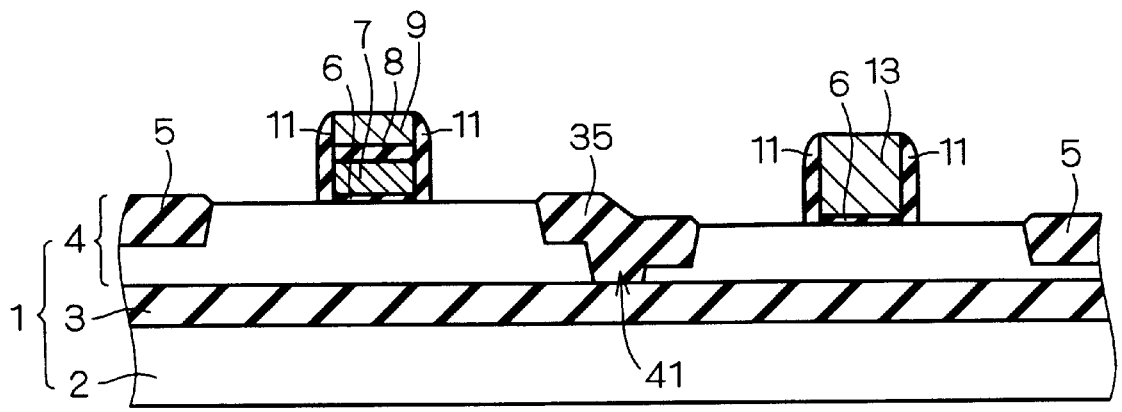

Next, both in the memory cell array portion and the low-voltage logic circuit portion, the gate electrode structures are formed on the upper surface of the silicon layer 4 (FIG. 34). Specifically, a floating gate material is formed in the memory cell array portion in advance, and after entirely forming, e.g., a polycide structure consisting of polysilicon and tungsten silicide, the polycide structure is patterned to form a gate electrode structure.

After that, with the gate electrode structure and the isolation insulating films 5 and 35 used as a mask, impurity ions are implanted into the silicon layer 4, to form the source/drain regions 12 and 36, thereby obtaining the structure shown in FIG. 30.

Referring to FIGS. 13 and 14, the partial-isolation insulating films 5 and 15 are formed in the interface between the memory cell array portion and the low-voltage logic circuit portion, and the silicon layer 4 exists between the bottom surfaces of the isolation insulating films 5 and 15 and the upper surface of the BOX layer 3. Therefore, the noises generated in the memory cell array portion and the low-voltage logic circuit portion are likely to be mutually propagated through the silicon layer 4 and the memory cell transistor and the low-voltage logic circuit are likely to be mutually affected by the noises.

In contrast, the isolation insulating films 16 and 35 having the full isolation portions 40 and 41, respectively, are formed in the interface between the memory cell array portion and the low-voltage logic circuit portion in the semiconductor integrated circuit of the sixth preferred embodiment. Therefore, it is possible to suppress mutual propagation of the noises in the memory cell array portion and the low-voltage logic circuit portion and a semiconductor integrated circuit which is unlikely to be affected by the noise can be obtained.

Further, though the foregoing discussion has been made on the case where the isolation insulating films 16 and 35 having the full isolation portions 40 and 41 at part of their bottom surfaces, the same effect as above can be obtained even if a full-isolation insulating film having a bottom surface reaching the upper surface of the BOX layer 3 is formed, instead of the isolation insulating films 16 and 35.

The Seventh Preferred Embodiment

Figure 35:
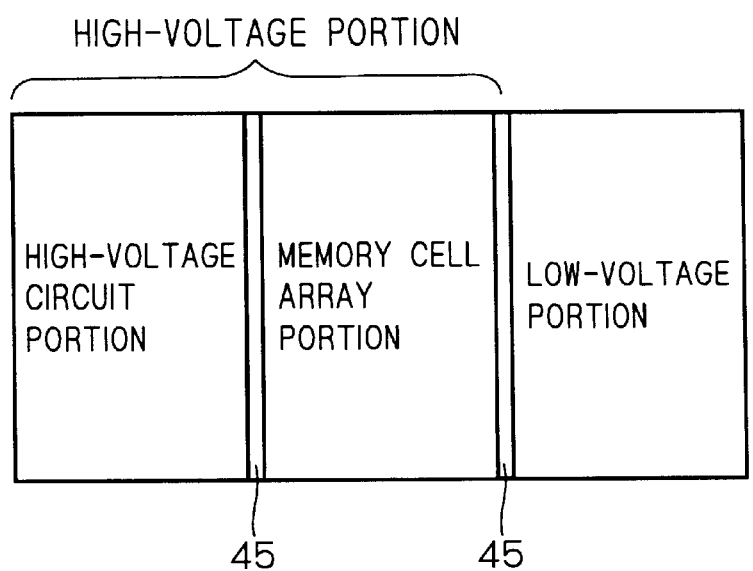
FIG. 35 is a plan view schematically showing a structure of a semiconductor integrated circuit in accordance with a seventh preferred embodiment of the present invention.
Figure 36:
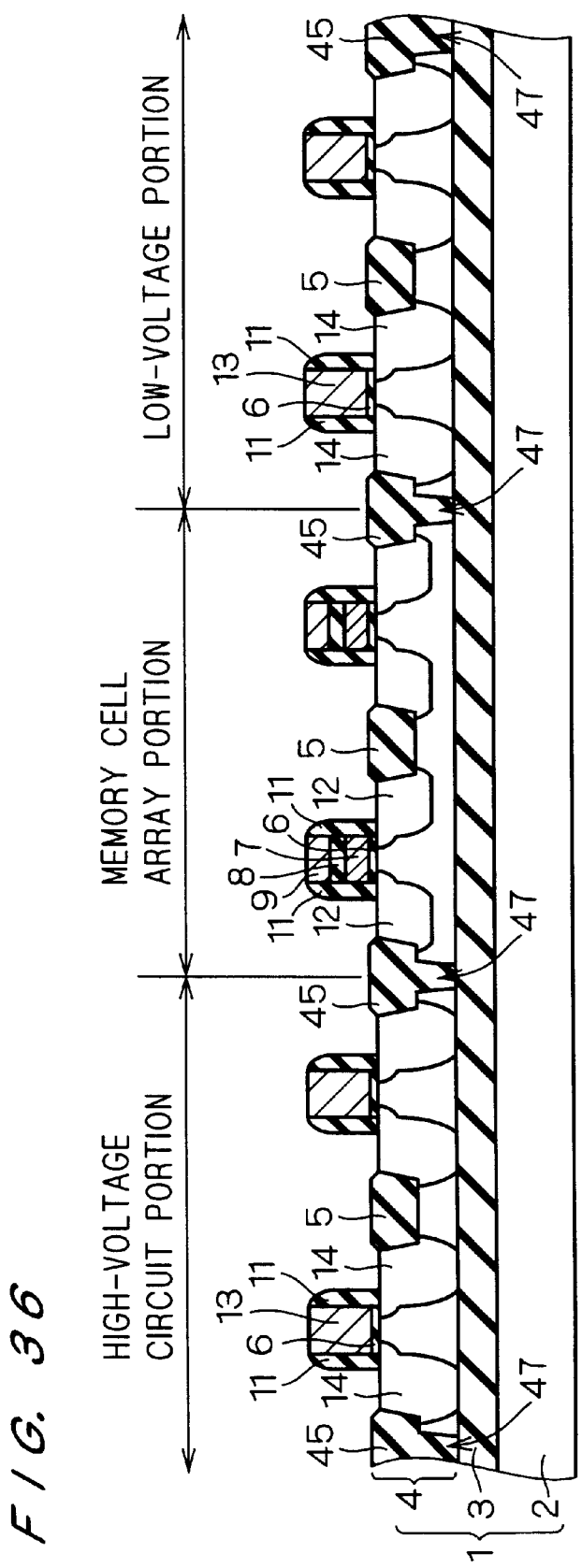
FIG. 36 is a cross section schematically showing a cross-sectional structure of the semiconductor integrated circuit in accordance with the seventh preferred embodiment of the present invention.

FIG. 35 is a plan view schematically showing a structure of a semiconductor integrated circuit in accordance with the seventh preferred embodiment of the present invention. FIG. 36 is a cross section schematically showing a cross-sectional structure of the semiconductor integrated circuit in accordance with the seventh preferred embodiment of the present invention. As shown in FIGS. 35 and 36, the semiconductor integrated circuit of the seventh preferred embodiment comprises a low-voltage portion including the above low-voltage logic circuit portion and the like and a high-voltage portion where a voltage higher than that in the low-voltage portion is dealt. The high-voltage portion has a high-voltage circuit portion and the memory cell array portion, and the high-voltage circuit portion and the low-voltage portion are arranged on the opposite sides of the substrate with the memory cell array portion interposed therebetween. The high-voltage circuit portion is isolated from the memory cell array portion by an isolation insulating film 45. Further, the low-voltage portion is isolated from the memory cell array portion by the isolation insulating film 45. As shown in FIG. 36, the isolation insulating film 45 has a full isolation portion 47 at part of its bottom surface. A full-isolation insulating film may be formed instead of the isolation insulating film 45.

In the memory cell array portion, a plurality of memory cell transistors which are isolated from one another by the partial-isolation insulating film 5 are formed in a matrix. The inventions of the first to third preferred embodiments may be applied to the memory cell array portion.

Further, in the low-voltage portion formed are a plurality of low-voltage transistors which are driven by a voltage lower than a driving voltage of the memory cell transistor. The low-voltage transistors adjacent to each other are isolated by the isolation insulating film 5. The inventions of the fourth and fifth preferred embodiments may be applied to the memory cell array portion and the low-voltage portion. In the high-voltage circuit portion formed are a plurality of high-voltage transistors which are driven by a voltage higher than the driving voltage of the low-voltage transistor. The high-voltage transistor adjacent to each other are isolated by the isolation insulating film 5.

Thus, in the semiconductor integrated circuit of the seventh preferred embodiment, since the high-voltage circuit portion and the low-voltage portion are arranged on the opposite sides of the substrate with the memory cell array portion interposed therebetween, it is possible to suppress the effect of the high-voltage circuit portion which is likely to become a source of noise on the low-voltage portion.

Further, since the low-voltage portion and the memory cell array portion, and the memory cell array portion and the high-voltage circuit portion are isolated from each other by the isolation insulating film 45 having the full isolation portion 47 or the full-isolation insulating film, it is possible to suppress mutual propagation of the noises generated in the low-voltage portion, the memory cell array portion and the high-voltage circuit portion through the silicon layer 4 and a semiconductor integrated circuit which is unlikely to be affected by the noise can be obtained.

Figure 37:
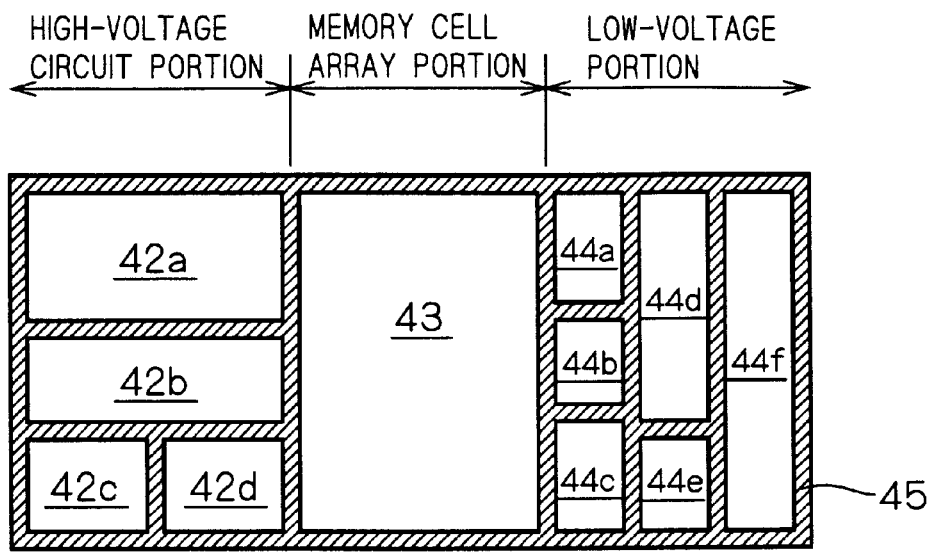
FIG. 37 is a plan view schematically showing a structure of a semiconductor integrated circuit in accordance with a first variation of the seventh preferred embodiment of the present invention.

FIG. 37 is a plan view schematically showing a structure of a semiconductor integrated circuit in accordance with the first variation of the seventh preferred embodiment of the present invention. The high-voltage circuit portion is divided into a plurality of circuit blocks 42a to 42d, and the low-voltage portion is divided into a plurality of circuit blocks 44a to 44f. The circuit blocks adjacent to each other are isolated by the isolation insulating film 45. The semiconductor integrated circuit in accordance with the first variation of the seventh preferred embodiment can prevent the noises from being mutually affected between the circuit blocks in the high-voltage circuit portion and the low-voltage portion.

Figure 38:
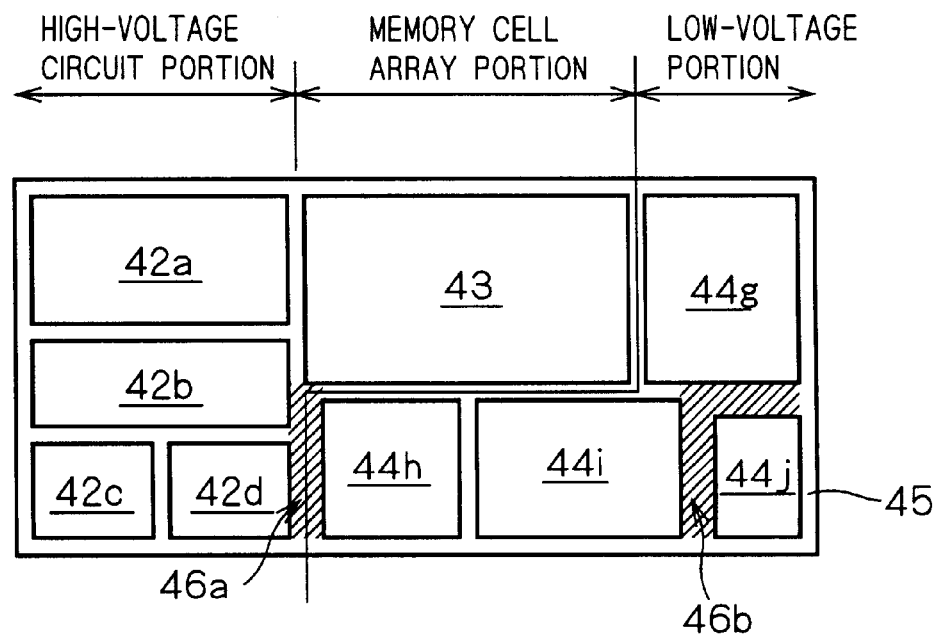

FIG. 38 is a plan view schematically showing a structure of a semiconductor integrated circuit in accordance with the second variation of the seventh preferred embodiment of the present invention. Like in the semiconductor integrated circuit of the first variation, the isolation insulating films 45 are formed between the high-voltage circuit portion and the memory cell array portion and between the memory cell array portion and the low-voltage portion, and the isolation insulating films 45 are also formed between the circuit blocks in the high-voltage circuit portion and the low-voltage portion.

In the semiconductor integrated circuit in accordance with the second variation of the seventh preferred embodiment, part of the high-voltage circuit portion and part of low-voltage portion are arranged adjacently to each other, for convenience of layout, and an isolation insulating film 46a which is wider than the isolation insulating film 45 is formed between the adjacent high-voltage circuit portion and low-voltage portion. The isolation insulating film 46a is an isolation insulating film having the full isolation portion 47 like the isolation insulating film 45 or a full-isolation insulating film. In the semiconductor integrated circuit in accordance with the second variation of the seventh preferred embodiment, since the wide isolation insulating film 46a whose isolation performance is higher than that of the isolation insulating film 45 is formed between the adjacent high-voltage circuit portion and low-voltage portion, it is possible to prevent the noises from mutually affecting the adjacent high-voltage circuit portion and low-voltage portion.

Further, in semiconductor integrated circuits in accordance with the first and second variations of the seventh preferred embodiment, when an RF (Radio Frequency) circuit for dealing an analog microsignal of radio frequency is formed in the low-voltage portion, it is desirable to form the radio frequency circuit in the circuit blocks 44f and 44j which are positioned farthest away from the high-voltage circuit portion. This can relieve the effect of noise generated in the high-voltage circuit portion on the radio frequency circuit.

Further, referring to FIG. 38, there may be a case where a wide isolation insulating film 46b having great isolation performance may be formed between the adjacent circuit blocks 44j and 44g and between the adjacent circuit blocks 44j and 44i when the radio frequency circuit is formed in the circuit block 44j. The isolation insulating film 46b is an isolation insulating film having the full isolation portion 47 like the isolation insulating film 45 or a full-isolation insulating film. This can further relieve the effect of noise generated in regions other than the circuit block 44j on the radio frequency circuit.

The Eighth Preferred Embodiment

Figure 39:
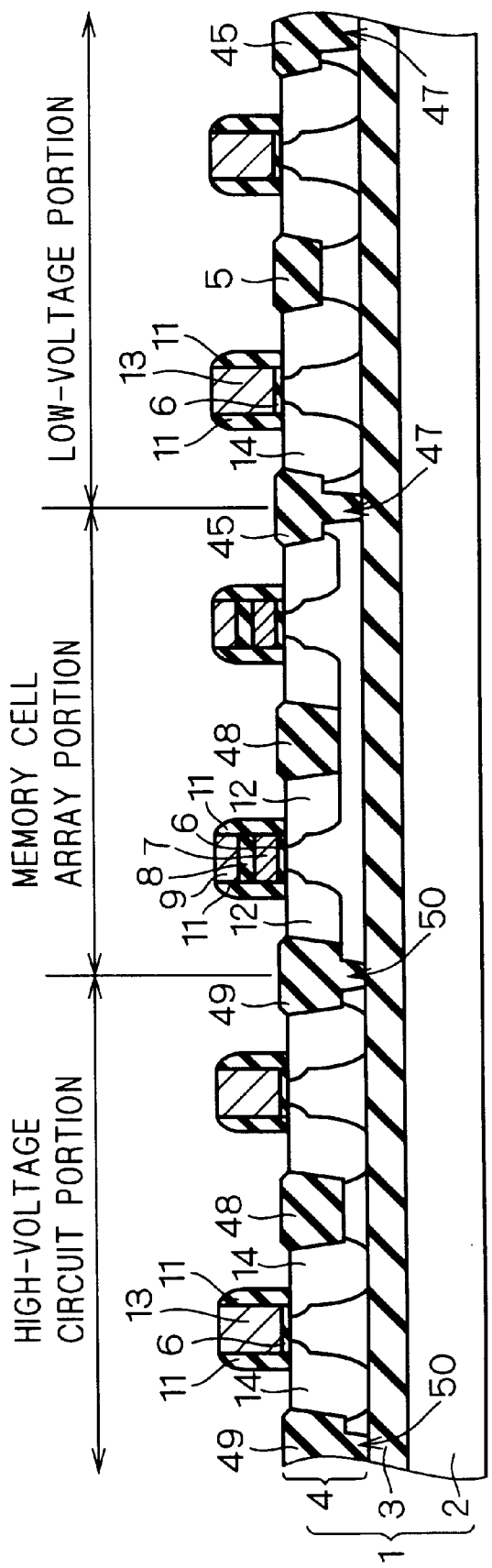
FIG. 39 is a cross section schematically showing a structure of a semiconductor integrated circuit in accordance with an eighth preferred embodiment of the present invention.

FIG. 39 is a cross section schematically showing a structure of a semiconductor integrated circuit in accordance with the eighth preferred embodiment of the present invention. As shown in FIG. 39, the semiconductor integrated circuit of the eighth preferred embodiment has a basic structure of the semiconductor integrated circuit of the seventh preferred embodiment shown in FIG. 36 and isolation insulating films 48 and 49 in the high-voltage circuit portion and the memory cell array portion are formed deeper than the isolation insulating films 5 and 45 in the low-voltage portion.

The isolation insulating film 48 is a partial-isolation insulating film and formed between the adjacent high-voltage transistors in the high-voltage circuit portion and between the adjacent memory cell transistors in the memory cell array portion. Further, the isolation insulating film 49 has a full isolation portion 50 at part of its bottom surface and is formed between the high-voltage circuit portion and the memory cell array portion.

Thus, in the semiconductor integrated circuit of the eighth preferred embodiment, since the isolation insulating films 48 and 49 in the high-voltage circuit portion and the memory cell array portion are formed deeper than the isolation insulating films 5 and 45 in the low-voltage portion, it is possible to enhance the isolation breakdown voltage of the isolation insulating films 48 and 49 in the high-voltage portion in which a voltage higher than that in the low-voltage portion is dealt.

The Ninth Preferred Embodiment

Figure 40:
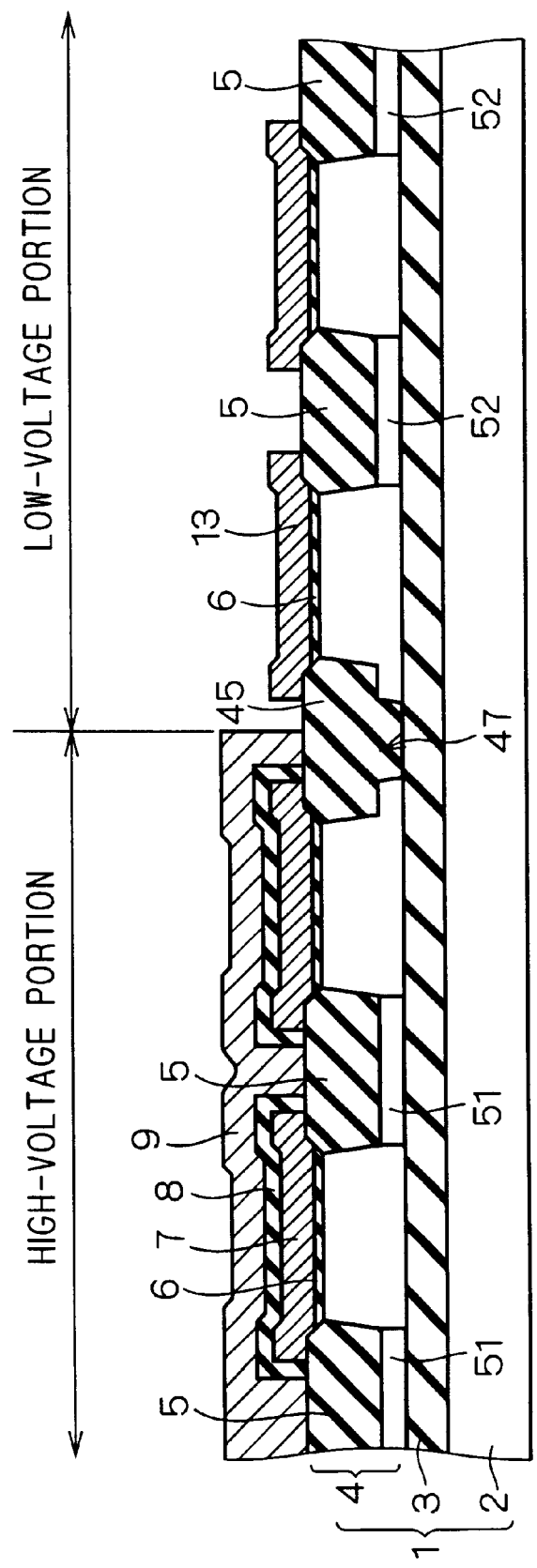
FIG. 40 is a cross section schematically showing a structure of a semiconductor integrated circuit in accordance with a ninth preferred embodiment of the present invention.

FIG. 40 is a cross section schematically showing a structure of a semiconductor integrated circuit in accordance with the ninth preferred embodiment of the present invention. In FIG. 40, the high-voltage circuit portion and the memory cell array portion of the eighth preferred embodiment are shown together as the "high-voltage portion". This also applies to the following FIGS. 41 to 43. In the low-voltage portion, a channel cut layer 52 is formed in the silicon layer 4 of the portion between the bottom surface of the isolation insulating film 5 and the upper surface of the BOX layer 3. Further, in the high-voltage portion, a channel cut layer 51 whose impurity concentration is higher than that of the channel cut layer 52 is formed in the silicon layer 4 of the portion between the bottom surface of the isolation insulating film 5 and the upper surface of the BOX layer 3.

Thus, in the semiconductor integrated circuit of the ninth preferred embodiment, since the impurity concentration of the channel cut layer 51 formed in the high-voltage portion is made higher than that of the channel cut layer 52 formed in the low-voltage portion, it is possible to enhance the isolation breakdown voltage between elements in the high-voltage portion.

The Tenth Preferred Embodiment

Figure 41:
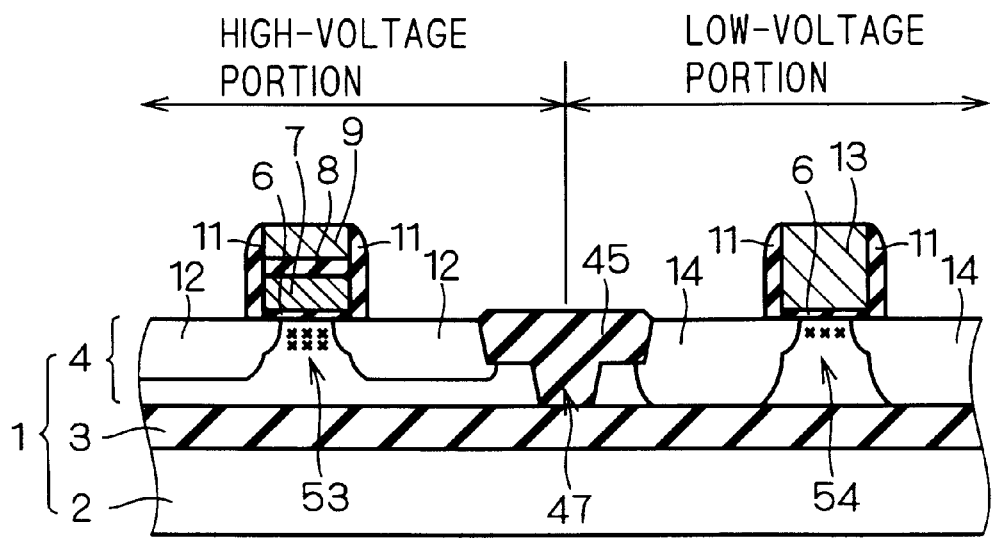
Figure 42:
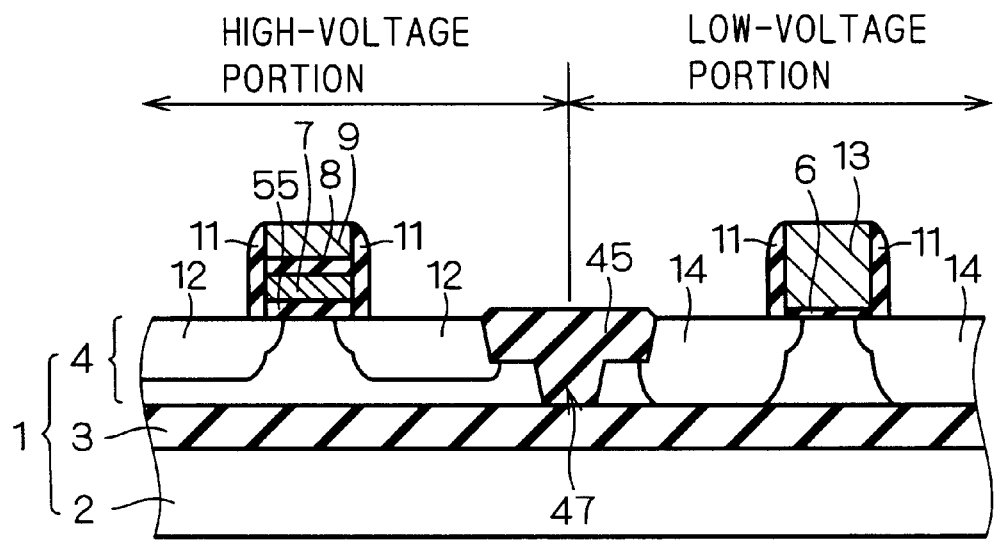

FIGS. 41 to 43 are cross sections schematically showing a structure of a semiconductor integrated circuit in accordance with the tenth preferred embodiment of the present invention. Referring to FIG. 41, transistors are formed both in the high-voltage portion and the low-voltage portion of the SOI substrate 1. Further, a channel dope region 54 is formed in the silicon layer 4 of the low-voltage portion and a channel dope region 53 whose impurity concentration is higher than that of the channel dope region 54 is formed in the silicon layer 4 of the high-voltage portion.

Referring to FIG. 42, transistors are formed both in the high-voltage portion and the low-voltage portion of the SOI substrate 1. The film thickness of a gate oxide film 55 of a transistor formed in the high-voltage portion is thicker than that of the gate oxide film 6 of a transistor formed in the low-voltage portion.

Referring to FIG. 43, transistors are formed both in the high-voltage portion and the low-voltage portion of the SOI substrate 1. The gate length of a transistor formed in the high-voltage portion is longer than that of a transistor formed in the low-voltage portion. The structures shown in FIGS. 41 to 43 may be optionally combined.

Thus, in the semiconductor integrated circuit of the tenth preferred embodiment, since the threshold voltage of the transistor formed in the high-voltage portion can be set higher than that of the transistor formed in the low-voltage portion, it is possible to enhance a punch through resistance of the transistor in the high-voltage portion.

The Eleventh Preferred Embodiment

Figure 44:
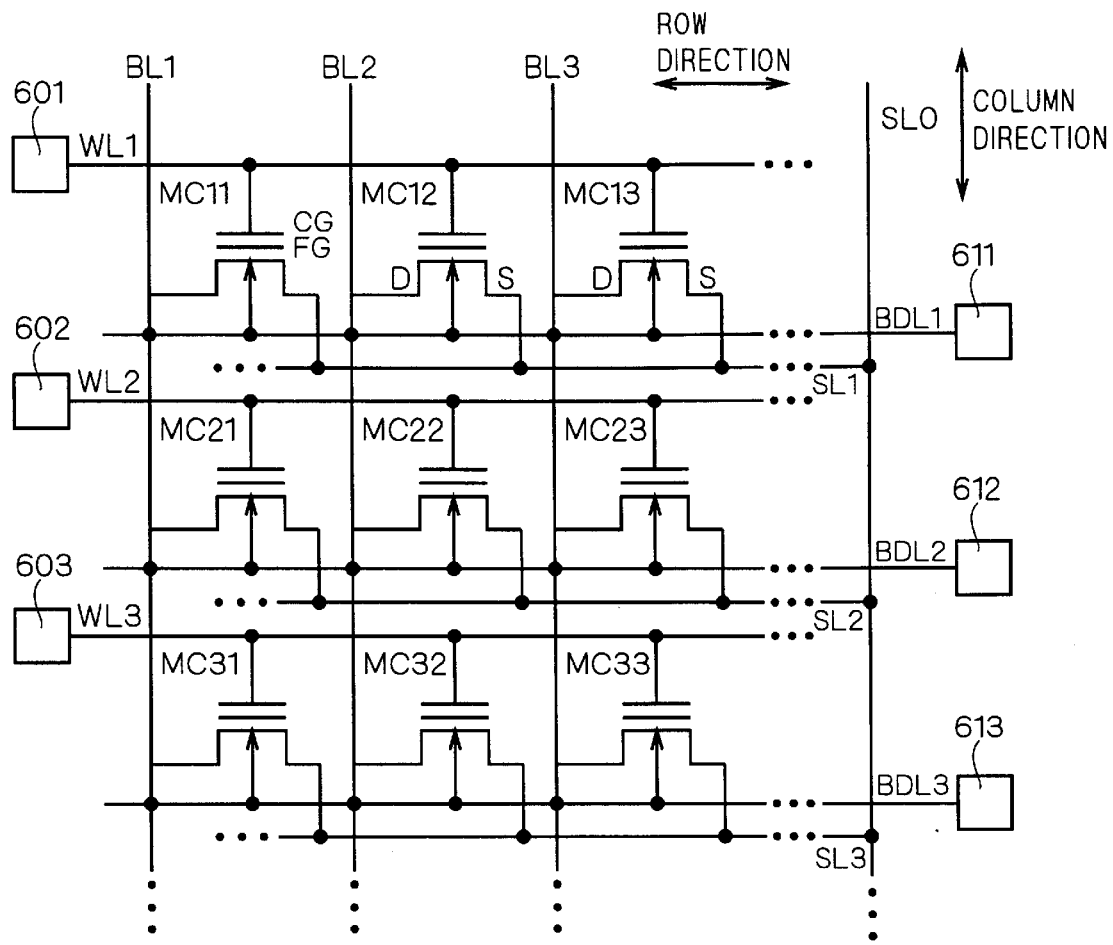
FIG. 44 is a circuit diagram showing part of a configuration of a memory cell array in a nonvolatile semiconductor memory device in accordance with an eleventh preferred embodiment of the present invention.

The invention of the eleventh preferred embodiment can be applied to the nonvolatile semiconductor memory device having the structure in which both the source region and the drain region reach the upper surface of the BOX layer 3 as shown in FIG. 7. FIG. 44 is a circuit diagram showing part of a configuration of a memory cell array in a flash memory in accordance with the eleventh preferred embodiment of the present invention. FIG. 44 shows the configuration consisting of only nine memory cells in a matrix with three rows and three columns. The memory cell transistors belonging to a row are connected to a common body line. For example, the memory cell transistors in the memory cells MC11 to MC13 are connected in common to a body line BDL1.

The word lines WL1 to WL3 are connected to driving circuits 601 to 603 for word line, respectively. Further, the body lines BDL1 to BDL3 are connected to driving circuits 611 to 613 for body line, respectively. In this case, as shown in FIG. 44, it is desirable that the driving circuits 601 to 603 and the driving circuits 611 to 613 should be arranged on the opposite sides of the substrate with the memory cell array interposed therebetween.

In a general flash memory, the write operation of data is performed by applying voltages of, e.g., 0 V, 5 V and 12 V to the source S, the drain D and the control gate CG, respectively, and implanting hot electrons into the floating gate FG.

Figure 45:
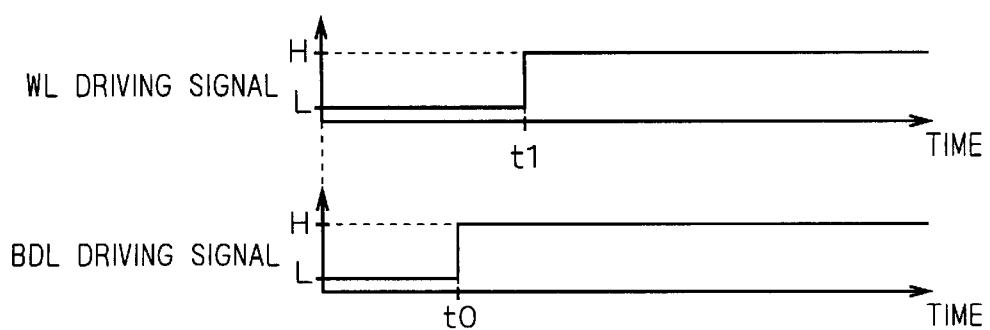
FIG. 45 is a timing chart showing waveforms of driving signals applied to a word line and a body line in the nonvolatile semiconductor memory device in accordance with the eleventh preferred embodiment of the present invention.
Figure 46:
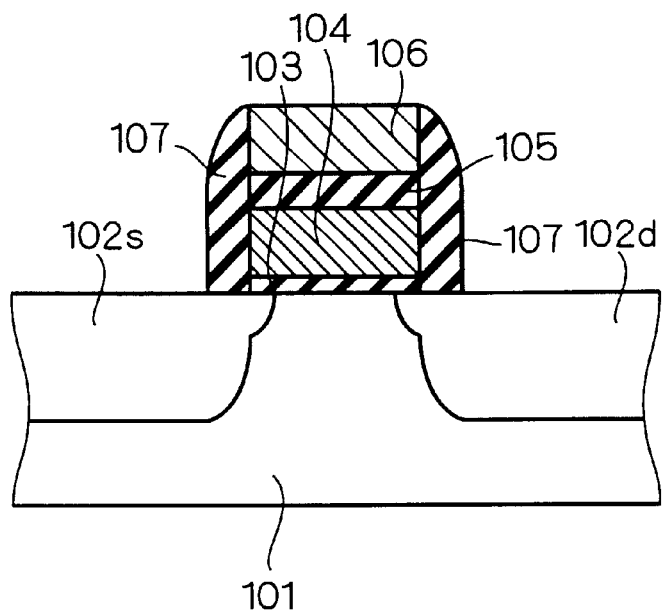
FIG. 46 is a cross section schematically showing a structure of a memory cell transistor in a flash memory using a bulk substrate.
Figure 47:
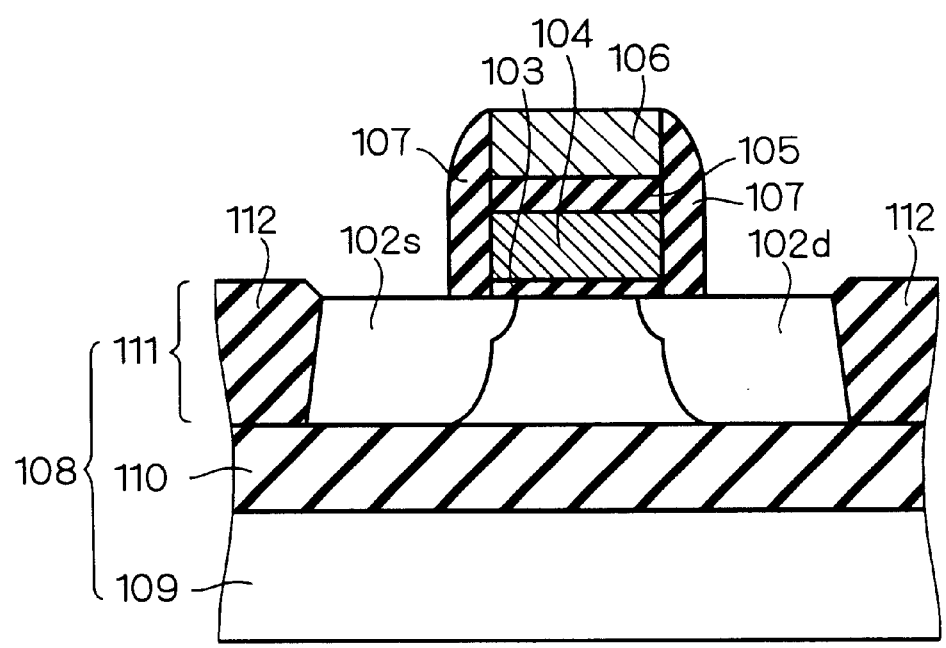
FIG. 47 is a cross section schematically showing a structure of a memory cell transistor in a nonvolatile semiconductor memory device of the background art.
Figure 48:
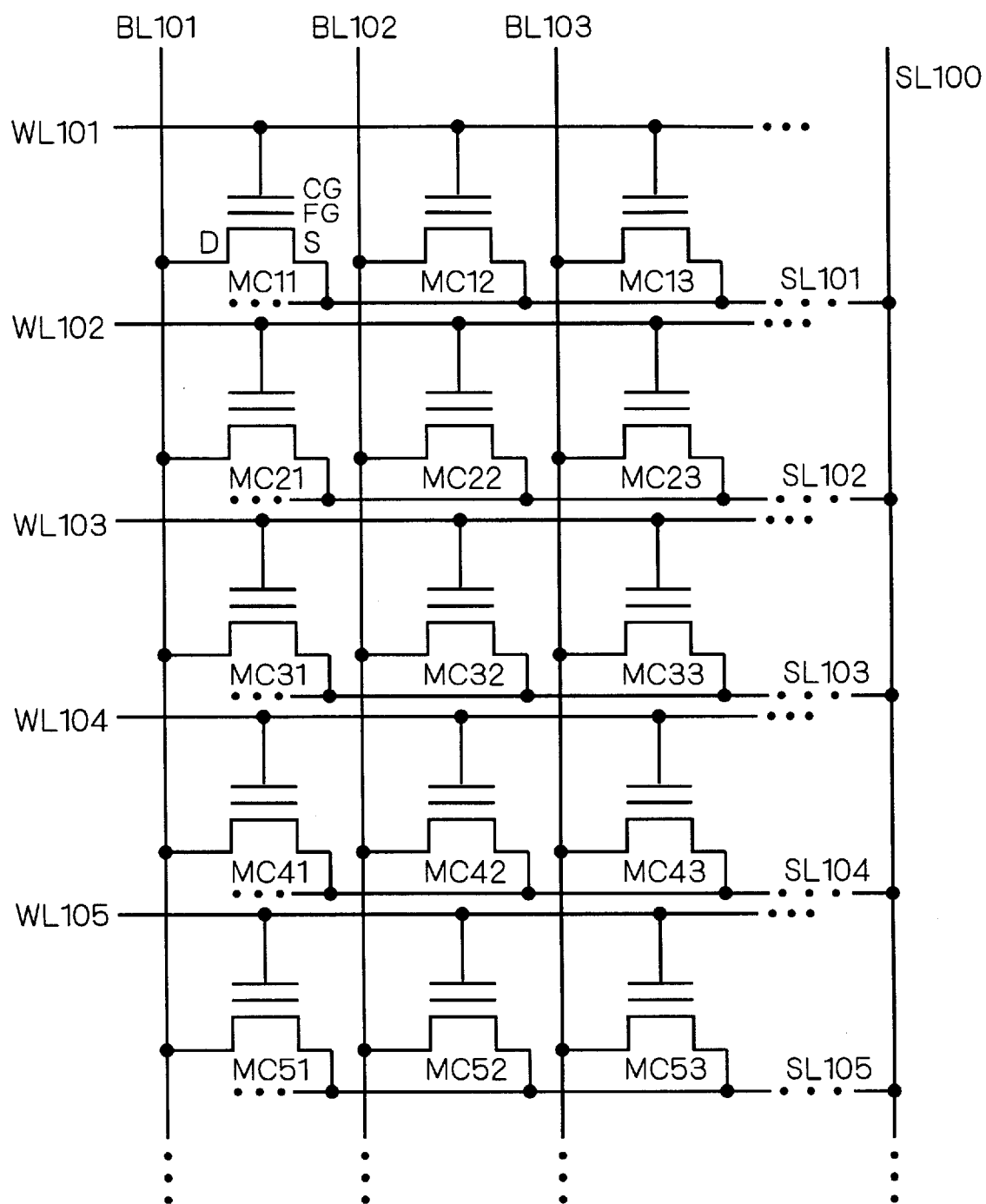
FIG. 48 is a circuit diagram showing part of a configuration of a memory cell array in the nonvolatile semiconductor memory device of the background art.

In the eleventh preferred embodiment, to perform the write operation of data, a voltage is also applied to the body lines BDL1 to BDL3. FIG. 45 is a timing chart showing waveforms of a word line (WL) driving signal and a body line (BDL) driving signal applied to the word line and the body line, respectively, in writing data. The WL driving signal shifts from L level to H level at time t1. In this case, it is desirable that the BDL driving signal should shift from L level to H level at time t2 earlier than the time t1. In other words, it is desirable to drive the body line BDL before the word line WL.

The body line BDL made of silicon has higher resistance and slower propagation speed of signal than the word line WL made of silicide and the like. By driving the body line BDL before the word line WL, however, it is possible to avoid the lag of the BDL driving signal behind the WL driving signal.

Thus, in the nonvolatile semiconductor memory device of the eleventh preferred embodiment, to perform the write operation of data, the body line BDL is driven as well as the word line WL. Since this makes it possible to carry a bipolar current from the source S to the drain D of the memory cell transistor, it is possible to improve the efficiency in writing data. For example, by applying a voltage of 0.3 V to the body line BDL, the voltage to be applied to the word line WL can be reduced to 10 V. It thereby becomes possible to reduce power consumption.

Further, since the driving circuits 601 to 603 and the driving circuits 611 to 613 are arranged on the opposite sides of the substrate with the memory cell array interposed therebetween, it is possible to offset the effect of voltage drop caused by the resistances of the word line WL and the body line BDL. This makes the writing characteristics uniform in a plurality of memory cells belonging to a row.

Furthermore, it is desirable that a non-selected body line BDL should be given a voltage of 0 V from the driving circuits 611 to 613 or a voltage having a polarity reverse to that of a selected body line BDL (e.g., −0.3 V). This can avoid occurrence of disturb failure.

While the invention has been shown and described in detail, the foregoing description is in all aspects illustrative and not restrictive. It is therefore understood that numerous modifications and variations can be devised without departing from the scope of the invention.

What is claimed is:

1. A nonvolatile semiconductor memory device comprising:
    an SOI substrate in which a semiconductor substrate, an insulating layer and a semiconductor layer are layered in this order;
    a plurality of memory cell transistors arranged in a matrix, each having a source region and a drain region which are formed away from each other in a main surface of said semiconductor layer, a first gate electrode formed on a body region between said source region and said drain region with an insulating film interposed therebetween, and a second gate electrode formed on said first gate electrode with an insulating film interposed therebetween;
    an isolation insulating film formed between adjacent ones of said plurality of memory cell transistors in a row direction perpendicular to a direction in which said source region and said drain region of each of said plurality of memory cell transistors are aligned in said main surface of said semiconductor layer, having a bottom surface which does not reach said insulating layer; and
    an impurity introduction region formed between said source regions included in adjacent ones of said plurality of memory cell transistors in said row direction in said semiconductor layer, having the same conductivity type as said source region has.

2. The nonvolatile semiconductor memory device according to claim 1, wherein
    said source region or a depletion layer in a pn junction between said source region and said semiconductor layer does not reach said insulating layer.

3. The nonvolatile semiconductor memory device according to claim 2, wherein
    said drain region or a depletion layer in a pn junction between said drain region and said semiconductor layer does not reach said insulating layer.

4. The nonvolatile semiconductor memory device according to claim 2, wherein
    said drain region or a depletion layer in a pn junction between said drain region and said semiconductor layer reaches said insulating layer.

5. The nonvolatile semiconductor memory device according to claim 1, wherein
    both said source region and said drain region or both depletion layers in pn junctions between said source region and said semiconductor layer and between said drain region and said semiconductor layer reach said insulating layer,
    said the nonvolatile semiconductor memory device further comprising:
    a word line connected in common to said second gate electrodes included in said plurality of memory cell transistors belonging to a row;

a body line connecting said body regions included in said plurality of memory cell transistors belonging to a row;

a first driving circuit connected to said word line, for supplying said word line with a first driving signal; and a second driving circuit connected to said body line, for supplying said body line with a second driving signal.

6. The nonvolatile semiconductor memory device according to claim 5, wherein said first and second driving circuits are arranged on the opposite sides with a memory cell array portion sandwiched therebetween, in which a plurality of memory cells including said plurality of memory cell transistors are arranged.

7. The nonvolatile semiconductor memory device according to claim 5, wherein said second driving circuit supplies said body line which is selected in reading data with a first potential as said second driving signal and supplies said body line which is not selected with a ground potential or a second potential having a polarity reverse to that of said first potential as said second driving signal.

8. The nonvolatile semiconductor memory device according to claim 5, wherein said second driving circuit supplies said body line with said second driving signal before said first driving circuit supplies said word line with said first driving signal.

9. A nonvolatile semiconductor memory device comprising:

an SOI substrate in which a semiconductor substrate, an insulating layer and a semiconductor layer are layered in this order;

a plurality of memory cell transistors arranged in a matrix, each having a source region and a drain region which are formed away from each other in a main surface of said semiconductor layer, a first gate electrode formed on a body region between said source region and said drain region with an insulating film interposed therebetween, and a second gate electrode formed on said first gate electrode with an insulating film interposed therebetween; and an isolation insulating film formed between adjacent ones of said plurality of memory cell transistors in a row direction perpendicular to a direction in which said source region and said drain region of each of said plurality of memory cell transistors are aligned in said main surface of said semiconductor layer, having a bottom surface which does not reach said insulating layer, wherein said source region or a depletion layer in a pn junction between said source region and said semiconductor layer does not reach said insulating layer, and said drain region or a depletion layer in a pn junction between said drain region and said semiconductor layer reaches said insulating layer.

10. The nonvolatile semiconductor memory device according to claim 9, further comprising:

an impurity introduction region formed between said source regions included in adjacent ones of said plurality of memory cell transistors in said row direction in said semiconductor layer, having the same conductivity type as said source region has.

11. A nonvolatile semiconductor memory device comprising:

an SOI substrate in which a semiconductor substrate, an insulating layer and a semiconductor layer are layered in this order;

a plurality of memory cell transistors arranged in a matrix, each having a source region and a drain region which are formed away from each other in a main surface of said semiconductor layer, a first gate electrode formed on a body region between said source region and said drain region with an insulating film interposed therebetween, and a second gate electrode formed on said first gate electrode with an insulating film interposed therebetween;

an isolation insulating film formed between adjacent ones of said plurality of memory cell transistors in a row direction perpendicular to a direction in which said source region and said drain region of each of said plurality of memory cell transistors are aligned in said main surface of said semiconductor layer, having a bottom surface which does not reach said insulating layer;

a word line connected in common to said second gate electrodes included in said plurality of memory cell transistors belonging to a row;

a body line connecting said body regions included in said plurality of memory cell transistors belonging to a row;

a first driving circuit connected to said word line, for supplying said word line with a first driving signal; and a second driving circuit connected to said body line, for supplying said body line with a second driving signal, wherein both said source region and said drain region or both depletion layers in pn junctions between said source region and said semiconductor layer and between said drain region and said semiconductor layer reach said insulating layer.

12. The nonvolatile semiconductor memory device according to claim 11, wherein said first and second driving circuits are arranged on the opposite sides with a memory cell array portion sandwiched therebetween, in which a plurality of memory cells including said plurality of memory cell transistors are arranged.

13. The nonvolatile semiconductor memory device according to claim 11, wherein said second driving circuit supplies said body line which is selected in reading data with a first potential as said second driving signal and supplies said body line which is not selected with a ground potential or a second potential having a polarity reverse to that of said first potential as said second driving signal.

14. The nonvolatile semiconductor memory device according to claim 11, wherein said second driving circuit supplies said body line with said second driving signal before said first driving circuit supplies said word line with said first driving signal.

15. The nonvolatile semiconductor memory device according to claim 11, further comprising:

an impurity introduction region formed between said source regions included in adjacent ones of said plurality of memory cell transistors in said row direction in said semiconductor layer, having the same conductivity type as said source region has.

* * * * *